(12) United States Patent
Wang

(10) Patent No.: US 11,539,004 B2
(45) Date of Patent: Dec. 27, 2022

(54) ELECTROLUMINESCENT COMPOUND, THERMALLY ACTIVATED DELAYED FLUORESCENCE MATERIAL, AND APPLICATION THEREOF

(71) Applicant: WuHan TianMa Micro-Electronics Co., Ltd., Wuhan (CN)

(72) Inventor: Kui Wang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 418 days.

(21) Appl. No.: 16/858,759

(22) Filed: Apr. 27, 2020

(65) Prior Publication Data
US 2020/0259088 A1   Aug. 13, 2020

(30) Foreign Application Priority Data
Oct. 31, 2019   (CN) .......................... 201911063213.8

(51) Int. Cl.
H01L 51/00     (2006.01)
C09K 11/06     (2006.01)
H01L 51/50     (2006.01)

(52) U.S. Cl.
CPC ............ *H01L 51/008* (2013.01); *C09K 11/06* (2013.01); *H01L 51/0059* (2013.01); (Continued)

(58) Field of Classification Search
CPC .............. H01L 51/008; H01L 51/0059; H01L 51/0071; H01L 51/0072; H01L 51/0069; (Continued)

(56) References Cited

FOREIGN PATENT DOCUMENTS

CN      110078755 A     8/2019
WO    WO-2014025424 A2 *   2/2014    ........... G01T 1/2023

OTHER PUBLICATIONS

CN 110003255 A—translation with patent document (publication date Jul. 2019). (Year: 2019).*

(Continued)

*Primary Examiner* — Dawn L Garrett
(74) *Attorney, Agent, or Firm* — Kilpatrick Townsend & Stockton, LLP

(57) ABSTRACT

Provided are an electroluminescent compound having a structure represented by Formula I, a thermally activated delayed fluorescence material and an application thereof. The electroluminescent compound has TADF characteristics and may be applied to a light emitting layer of an OLED device as a thermally activated delayed fluorescence material. The OLED device includes an anode, a cathode, and at least one organic thin film layer comprising the thermally activated delayed fluorescence material in a light emitting layer between the anode and the cathode. The electroluminescent compound effectively reduces the overlap between HOMO and LUMO through special molecular structure design, so that $\Delta E_{ST}$ is reduced to less than 0.25 eV, which satisfies reverse crossing of energy from a triplet state to a singlet state, effectively improves transmission capacities of two kinds of carriers, improves carrier balance, and thus significantly improves light emitting efficiency of the OLED device.

15 Claims, 1 Drawing Sheet

(52) U.S. Cl.
CPC ...... *H01L 51/0071* (2013.01); *H01L 51/0072* (2013.01); *C09K 2211/1007* (2013.01); *C09K 2211/1014* (2013.01); *C09K 2211/1018* (2013.01); *H01L 51/0069* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC ............ H01L 51/5012; H01L 51/5016; H01L 51/5056; H01L 51/5072; H01L 51/5088; H01L 51/5092; H01L 51/5096; H01L 51/0081; H01L 51/0052; H01L 51/0065; H01L 51/0067; H01L 51/5024; C09K 11/06; C09K 2211/1007; C09K 2211/1014; C09K 2211/1018; C09K 2211/1011; C09K 2211/1029; C09K 2211/1033; C09K 2211/1037; C09K 2211/104; C09K 2211/1044; C09K 2211/1088; C07F 5/027
See application file for complete search history.

(56) References Cited

OTHER PUBLICATIONS

CN 110305149 A—translation and patent document (publication date Oct. 2019). (Year: 2019).*
Wang, B. J., & Groziak, M. P. (2016). Recent developments in the chemistry of boron heterocycles. Advances in Heterocyclic Chemistry, 118, 47-90. (Year: 2016).*
Campbell, P. G., Marwitz, A. J., & Liu, S. Y. (2012). Recent advances in azaborine chemistry. Angewandte Chemie International Edition, 51(25), 6074-6092. (Year: 2012).*
Bell et al., Dyes and Pigments, 141, (2017), pp. 83-92. (Year: 2017).*

* cited by examiner

ELECTROLUMINESCENT COMPOUND, THERMALLY ACTIVATED DELAYED FLUORESCENCE MATERIAL, AND APPLICATION THEREOF

CROSS-REFERENCE TO RELATED APPLICATIONS

The application claims the benefit of the earlier filing date of Chinese Patent Application No. 201911063213.8, filed on Oct. 31, 2019 to the CNIPA, the contents of which are incorporated by reference herein in its entirety.

FIELD

The present disclosure relates to the field of organic electroluminescent materials, and, in particular, to an electroluminescent compound, a thermally activated delayed fluorescence material, and an application thereof.

BACKGROUND

Organic light emitting displays (OLEDs) are a new type of panel display technology. Compared with liquid crystal displays (LCDs), OLEDs have advantages of active luminescence, fast response speeds, low energy consumption, low driving voltages, lightness and thinness, wide viewing angles, continuously adjustable light emitting color, low costs, simple production process, high light emitting efficiency, and flexible display. The OLEDs have drawn much attention of industrial and scientific communities and have been widely applied to flexible displays, panel displays, solid-state lighting, on-vehicle displays and other industries. At present, OLEDs have entered the industrialization stage, and the development of high-performance organic photoelectric materials is still the focus in the art.

Researches have shown that materials for the light emitting layer of OLEDs may be divided, according to their light emitting mechanism, into four types: fluorescent materials, phosphorescent materials, triplet-triplet annihilation (TTA) materials and thermally activated delayed fluorescence (TADF) materials. In fluorescent materials, singlet excited state $S_1$ excitons returns to the ground state $S_0$ through radiation transition. According to spin statistics, the ratio of singlet excitons to triplet excitons is 1:3, so the maximum internal quantum yield of a fluorescent material is not greater than 25%. According to the Lambert light emitting mode, the light extraction efficiency is about 20%, so external quantum efficiency (EQE) of an OLED device based on a fluorescent material is generally not higher than 5%. In phosphorescent materials, triplet excited state $T_1$ excitons decay directly and radiatively to the ground state $S_0$. Due to a heavy atom effect, intramolecular inter-system crossing may be enhanced by spin coupling interactions, and 75% of triplet excitons may be directly utilized to achieve the emission involving both $S_1$ and $T_1$ at room temperature. The theoretical maximum internal quantum yield can reach 100%. According to the Lambert light emitting mode, the light extraction efficiency is about 20%, so EQE of an OLED device based on a phosphorescent material can reach 20%. However, most phosphorescent materials are heavy metal complexes such as Ir, Pt, Os, Re, and Ru and their production costs are high, which is disadvantageous to large-scale production. Moreover, the phosphorescent material has a serious efficiency roll-off phenomenon at high current densities, which leads to poor stability of a phosphorescent OLED device. Two triplet excitons of the TTA material interact with each other to recombine into a molecule at a singlet excited state which is at a higher energy level and a molecule at a ground state. However, since two triplet excitons produce one singlet exciton, the theoretical maximum internal quantum yield is only 62.5%. In order to prevent a large efficiency roll-off phenomenon, the concentration of triplet excitons needs to be regulated in this process.

In TADF materials, when the energy level difference between state $S_1$ and state $T_1$ is small and the lifetime of an exciton at state $T_1$ is long, the exciton at state $T_1$ may switch from state $T_1$ to state $S_1$ through reverse inter-system crossing (RISC) and then decays radiatively from state $S_1$ to the ground state $S_0$ at a certain temperature. Therefore, the TADF material may utilize 75% of triplet excitons and 25% of singlet excitons and the theoretical maximum internal quantum yield can reach 100%. More importantly, most TADF materials are organic compounds without a rare metal element, resulting in low production costs, and they may be chemically modified by various methods to achieve further performance optimization.

CN109134520A, CN109503508A, CN108530357A, etc. have disclosed TADF materials and their application. However, only a small number of TADF materials have been found at present, and their performance is insufficient to satisfy the requirement on high-performance OLED devices.

Therefore, it is an urgent problem to be solved in the art to develop more kinds of new TADF materials with high performance.

SUMMARY

One embodiment of the present disclosure provides an electroluminescent compound having a structure represented by Formula I:

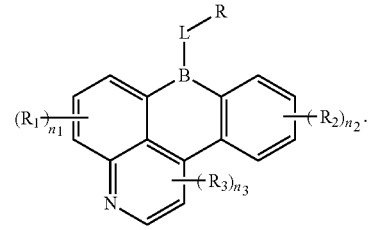

Formula I

In Formula I, R, $R_1$, $R_2$, and $R_3$ each is any one independently selected from a group consisting of substituted or unsubstituted C6 to C40 aryl, substituted or unsubstituted C3 to C40 heteroaryl, and substituted or unsubstituted C6 to C30 arylamino, and R, $R_1$, $R_2$, and $R_3$ are electron-donating groups.

C6 to C40 may be C7, C8, C10, C13, C15, C18, C20, C23, C25, C28, C30, C33, C35, C37, C39, or the like.

C3 to C40 may be C4, C5, C6, C8, C10, C13, C15, C18, C20, C23, C25, C28, C30, C33, C35, C37, C39, or the like.

C6 to C30 may be C7, C8, C9, C10, C13, C15, C18, C20, C23, C25, C27, C29, or the like.

The "electron-donating group" refers to a group that can increase the electron cloud density on a benzene ring. Exemplarily, the electron-donating group includes, but is not limited to, carbazolyl, arylamino, acridyl, phenothiazinyl, or phenoxazinyl.

When a substituent is present in the above groups, the substituent is at least one selected from a group consisting of C1 to C10 linear or branched alkyl, C1 to C10 alkoxy, and C1 to C10 thioalkoxy.

C1 to C10 may be C1, C2, C3, C4, C5, C6, C7, C8, C9, or C10.

In Formula I, L is C6 to C30 arylene or C3 to C30 heteroarylene.

C6 to C30 may be C7, C8, C9, C10, C13, C15, C18, C20, C23, C25, C27, C29, or the like.

C3 to C30 may be C4, C5, C6, C8, C10, C13, C15, C18, C20, C23, C25, C27, C29, or the like.

In Formula I, $n_1$ is an integer from 0 to 3, for example, 0, 1, 2, or 3.

In Formula I, $n_2$ is an integer from 0 to 4, for example, 0, 1, 2, 3, or 4.

In Formula I, $n_3$ is an integer from 0 to 2, for example, 0, 1, or 2.

One embodiment of the present disclosure provides a thermally activated delayed fluorescence material including any one of or a combination of at least two of the electroluminescent compounds described above.

In one embodiment of the present disclosure provides a display panel including an OLED device, wherein the OLED device includes an anode, a cathode, and at least one organic thin film layer between the anode and the cathode, wherein the organic thin film layer includes a light emitting layer.

The light emitting layer includes the thermally activated delayed fluorescence material described above, and the thermally activated delayed fluorescence material is used as any one of a host material, a guest material, or a co-doping material.

In one embodiment of the present disclosure provides an electronic apparatus including the display panel described above.

Compared with the existing art, the present disclosure has the following beneficial effects:

(1) The electroluminescent compound provided by the present disclosure is a small molecule compound containing a boron heterocycle. Large steric hindrance groups are connected to prevent the compound from aggregation and prevent conjugate planes from directly accumulating to form π-aggregation or excimers, improving light emitting efficiency.

(2) The thermally activated delayed fluorescence material based on the electroluminescent compound of the present disclosure has TADF characteristics. The large rigid twisted structure in the molecule effectively reduces the overlap between the highest occupied molecular orbit (HOMO) and the lowest unoccupied molecular orbit (LUMO), so that the energy level difference between the triplet state and the singlet state can be reduced to less than 0.25 eV, or even to less than 0.10 eV, which satisfies reverse crossing of energy from the triplet state to the singlet state, improving device efficiency, greatly improving the fluorescence lifetime to an order of μs, and resulting in a significant delayed fluorescence effect.

(3) The electroluminescent compound provided by the present disclosure has a large difference between the HOMO and the LUMO. The compound is twisted to a large degree and substituents are used to implement the emission over the whole visible spectrum. The compound can be used as a material of a light emitting layer of red, blue, or green light etc. to be applied to light emitting layer materials with various requirements.

(4) The parent structure (a boron naphthoquinoline) of the electroluminescent compound of the present disclosure is dry, has good thermal stability, and is not easy to be decomposed, has a relatively high glass transition temperature which can be 100° C. or more. An amorphous state appears during film formation process, which results in good compactness of the film and good stability of the device. In addition, the parent structure of the electroluminescent compound has a relatively small molecular weight and a relatively low evaporation temperature, and the material has a low decomposition degree and can be applied to an evaporation process to obtain OLED devices with high performance.

(5) The electroluminescent compound itself as provided by the present disclosure has a bipolar characteristic, and as the light emitting layer of an OLED device, can effectively improve transmission capabilities of two kinds of carriers, improve carrier balance, improve the light emitting efficiency of the device, reduce the voltage of the device, and increase the external quantum efficiency of the device to 16.5 to 23.5% and current efficiency to 19.0 to 61.3 Cd/A, so that application requirements for OLED devices with high performance can be fully satisfied.

DETAILED DESCRIPTION

Figure 1:
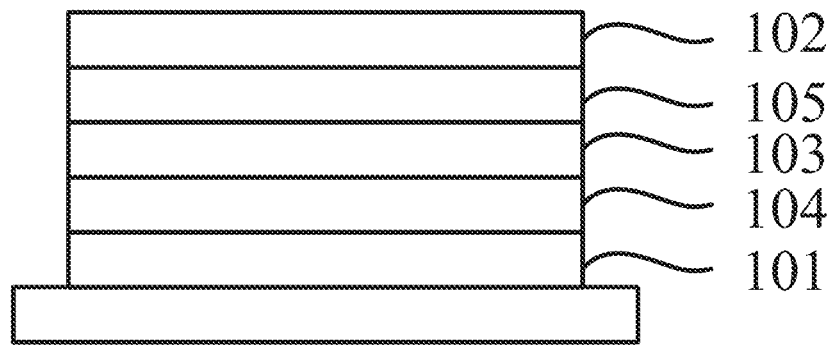
FIG. 1 is a structural diagram of an OLED device according to the present disclosure, wherein 101 is an anode, 102 is a cathode, 103 is a light emitting layer, 104 is a first organic thin film layer, and 105 is a second organic thin film layer.

Embodiments of the present disclosure are further described below through specific embodiments. Embodiments are merely used to help understand the present disclosure and should not be regarded as specific limitations on the present disclosure.

One embodiment of the present disclosure provides an electroluminescent compound having a structure represented by Formula I:

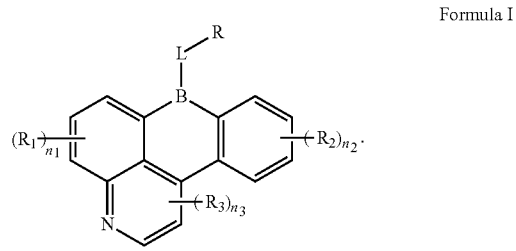

In Formula I, R, $R_1$, $R_2$, and $R_3$ each is any one independently selected from a group consisting of substituted or unsubstituted C6 to C40 aryl, substituted or unsubstituted C3 to C40 heteroaryl, and substituted or unsubstituted C6 to C30 arylamino, and R, $R_1$, $R_2$, and $R_3$ are electron-donating groups.

C6 to C40 may be C7, C8, C10, C13, C15, C18, C20, C23, C25, C28, C30, C33, C35, C37, C39, or the like.

C3 to C40 may be C4, C5, C6, C8, C10, C13, C15, C18, C20, C23, C25, C28, C30, C33, C35, C37, C39, or the like.

C6 to C30 may be C7, C8, C9, C10, C13, C15, C18, C20, C23, C25, C27, C29, or the like.

The "electron-donating group" refers to a group that can increase the electron cloud density on a benzene ring. Exemplarily, the electron-donating group includes, but is not limited to, carbazolyl, arylamino, acridyl, phenothiazinyl, or phenoxazinyl.

When a substituent is present in the above groups, the substituent is at least one selected from a group consisting of C1 to C10 linear or branched alkyl, C1 to C10 alkoxy, and C1 to C10 thioalkoxy.

C1 to C10 may be C1, C2, C3, C4, C5, C6, C7, C8, C9, or C10.

In Formula I, L is C6 to C30 arylene or C3 to C30 heteroarylene.

C6 to C30 may be C7, C8, C9, C10, C13, C15, C18, C20, C23, C25, C27, C29, or the like.

C3 to C30 may be C4, C5, C6, C8, C10, C13, C15, C18, C20, C23, C25, C27, C29, or the like.

In Formula I, $n_1$ is an integer from 0 to 3, for example, 0, 1, 2, or 3.

In Formula I, $n_2$ is an integer from 0 to 4, for example, 0, 1, 2, 3, or 4.

In Formula I, $n_3$ is an integer from 0 to 2, for example, 0, 1, or 2.

The electroluminescent compound provided by the present disclosure uses boron naphthoquinoline as its core to function as an electron acceptor, which is connected to groups R, $R_1$, $R_2$, and $R_3$ which function as electron donor. Large steric hindrance groups are connected to prevent the compound from aggregation and to prevent conjugate planes from directly accumulating to form π-aggregation or excimers, improving light emitting efficiency. The thermally activated delayed fluorescence material based on the electroluminescent compound has TADF characteristics, and may emit light by utilizing triplet excitons that are forbidden from transiting in traditional fluorescent molecules, improving device efficiency. The fundamental reason is that the large rigid twist in the molecule of the electroluminescent compound reduces the overlap between the HOMO and the LUMO, and reduces the energy level difference between the triplet state and the singlet state to less than 0.25 eV, which satisfies reverse crossing of energy from the triplet state to the singlet state and improves the device efficiency. The emission over the whole visible spectrum is implemented by a special design of the substituents. The electroluminescent compound itself has a bipolar characteristic, and as a light emitting layer of an OLED device, can effectively improve transmission capabilities of two kinds of carriers, improve carrier balance, improve fluorescence quantum efficiency of the device, and reduce the voltage of the device.

In an embodiment, R, $R_1$, $R_2$, and $R_3$ each is any one independently selected from the following groups, or any one independently selected from the following groups substituted by a substituent:

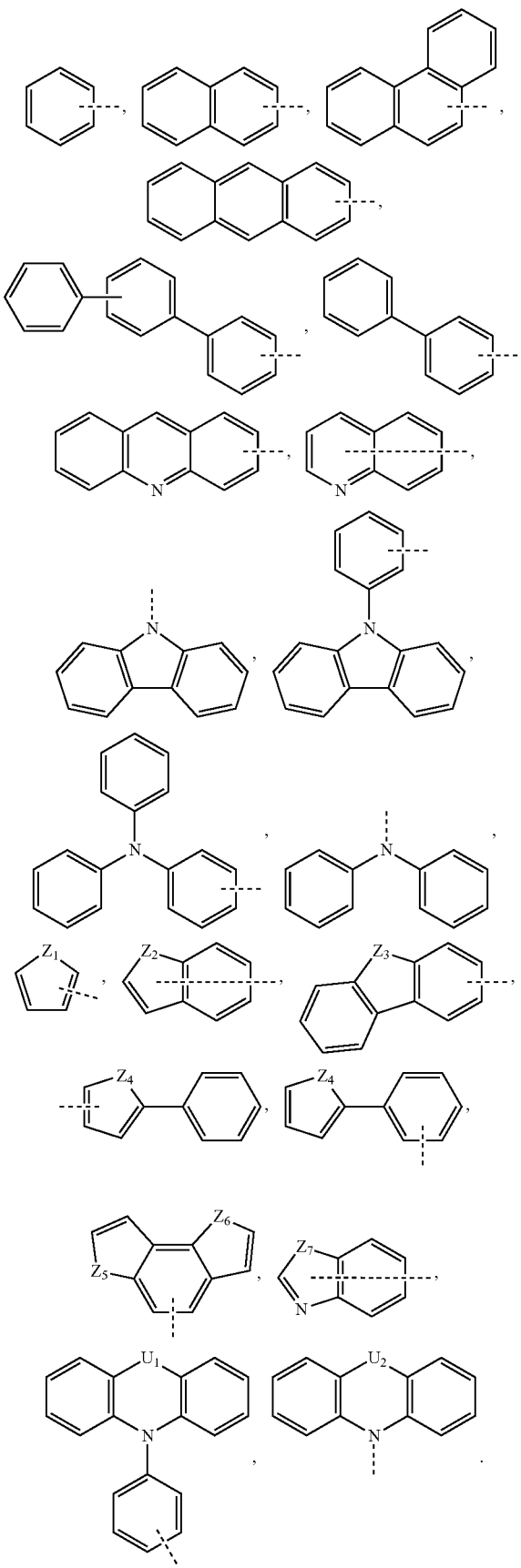

The dashed line represents a linkage site of the group.

$Z_1$ to $Z_7$ each is any one independently selected from a group consisting of O, S, and N—$R_{N1}$, and the N—$R_{N1}$ is connected to the five-membered ring through the N atom. Hereinafter the same description has the same meaning.

$U_1$ and $U_2$ each is any one independently selected from a group consisting of O, S, N—$R_{N2}$, and $R_{C1}$—C—$R_{C2}$, and the N—$R_{N2}$ is connected to the six-membered ring through the N atom, and the $R_{C1}$—C—$R_{C2}$ is connected to the six-membered ring through the C atom. Hereinafter the same description has the same meaning.

$R_{N1}$, $R_{N2}$, $R_{C1}$, and $R_{C2}$ each is any one selected from a group consisting of hydrogen, C1 to C10 (e.g., C2, C3, C4, C5, C6, C7, C8, or C9) linear or branched alkyl, C1 to C10 (e.g., C2, C3, C4, C5, C6, C7, C8, or C9) alkoxy, C6 to C20 (e.g., C7, C9, C10, C12, C14, C15, C17, or C19) aryl, and C3 to C20 (e.g., C4, C6, C8, C10, C12, C14, C16, or C18, etc.) heteroaryl.

The substituent is at least one selected from a group consisting of C1 to C10 (e.g., C2, C3, C4, C5, C6, C7, C8, or C9) linear or branched alkyl, C1 to C10 (e.g., C2, C3, C4, C5, C6, C7, C8, or C9) alkoxy, and C1 to C10 (e.g., C2, C3, C4, C5, C6, C7, C8, or C9) thioalkoxy.

In an embodiment, the electroluminescent compound has a structure represented by Formula II:

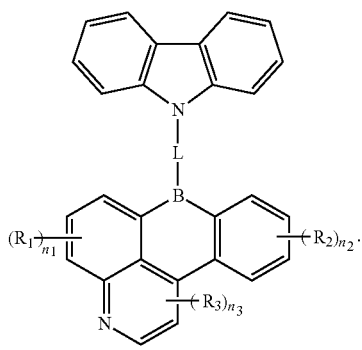

Formula II

In Formula II, $R_1$, $R_2$, and $R_3$ each independently has the same definition as in Formula I.

In Formula II, L is C6 to C30 (e.g., C7, C8, C9, C10, C13, C15, C18, C20, C23, C25, C27, or C29, etc.) arylene or C3 to C30 (e.g., C4, C5, C6, C8, C10, C13, C15, C18, C20, C23, C25, C27, or C29, etc.) heteroarylene.

In Formula II, $n_1$ is an integer from 0 to 3, for example, 0, 1, 2, or 3.

In Formula II, $n_2$ is an integer from 0 to 4, for example, 0, 1, 2, 3, or 4.

In Formula II, $n_3$ is an integer from 0 to 2, for example, 0, 1, or 2.

In an embodiment, the electroluminescent compound has a structure represented by Formula III:

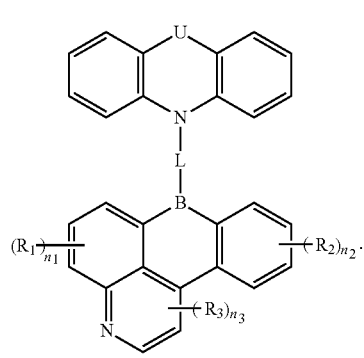

Formula III

In Formula III, U is any one selected from a group consisting of O, S, N—$R_{U1}$, and $R_{U2}$—C—$R_{U3}$, and $R_{U1}$, $R_{U2}$, and $R_{U3}$ each is any one independently selected from a group consisting of hydrogen, C1 to C10 (e.g. C2, C3, C4, C5, C6, C7, C8, or C9) linear or branched alkyl, C1 to C10 (e.g. C2, C3, C4, C5, C6, C7, C8, or C9) alkoxy, C6 to C20 (e.g. C7, C9, C10, C12, C14, C15, C17, or C19) aryl, and C3 to C20 (e.g. C4, C6, C8, C10, C12, C14, C16, or C18) heteroaryl.

In Formula III, $R_1$, $R_2$, and $R_3$ each independently has the same definition as in Formula I.

In Formula III, L is C6 to C30 (e.g., C7, C8, C9, C10, C13, C15, C18, C20, C23, C25, C27, or C29, etc.) arylene or C3 to C30 (e.g., C4, C5, C6, C8, C10, C13, C15, C18, C20, C23, C25, C27, or C29, etc.) heteroarylene.

In Formula III, $n_1$ is an integer from 0 to 3, for example, 0, 1, 2, or 3.

In Formula III, $n_2$ is an integer from 0 to 4, for example, 0, 1, 2, 3, or 4.

In Formula III, $n_3$ is an integer from 0 to 2, for example, 0, 1, or 2.

In an embodiment, U is any one selected from a group consisting of O, S, N—$R_{U1}$, and

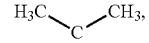

and $R_{U1}$ is C6 to C20 (e.g., C7, C9, C10, C12, C14, C15, C17, or C19, etc.) aryl or C3 to C20 (e.g., C4, C6, C8, C10, C12, C14, C16, or C18, etc.) heteroaryl.

In an embodiment, the electroluminescent compound has a structure represented by Formula IV:

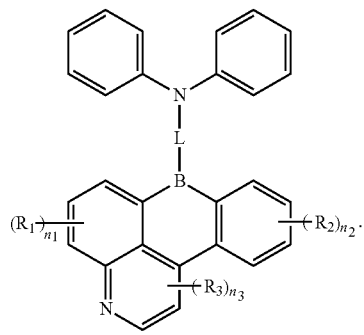

Formula IV

In Formula IV, $R_1$, $R_2$, and $R_3$ each independently has the same definition as in Formula I.

In Formula IV, L is C6 to C30 (e.g., C7, C8, C9, C10, C13, C15, C18, C20, C23, C25, C27, or C29, etc.) arylene or C3 to C30 (e.g., C4, C5, C6, C8, C10, C13, C15, C18, C20, C23, C25, C27, or C29, etc.) heteroarylene.

In Formula IV, $n_1$ is an integer from 0 to 3, for example, 0, 1, 2, or 3.

In Formula IV, $n_2$ is an integer from 0 to 4, for example, 0, 1, 2, 3, or 4.

In Formula IV, $n_3$ is an integer from 0 to 2, for example, 0, 1, or 2.

In an embodiment, L is selected from a group consisting of C6 to C24 (e.g., C7, C8, C9, C10, C13, C15, C18, C20, C22, or C23, etc.) arylene, C3 to C20 (e.g., C4, C6, C8, C10, C12, C14, C16, or C18, etc.) N-containing heteroarylene, and C3 to C20 (e.g., C4, C6, C8, C10, C12, C14, C16, or C18, etc.) O-containing heteroarylene.

In an embodiment, L is any one selected from the following groups:

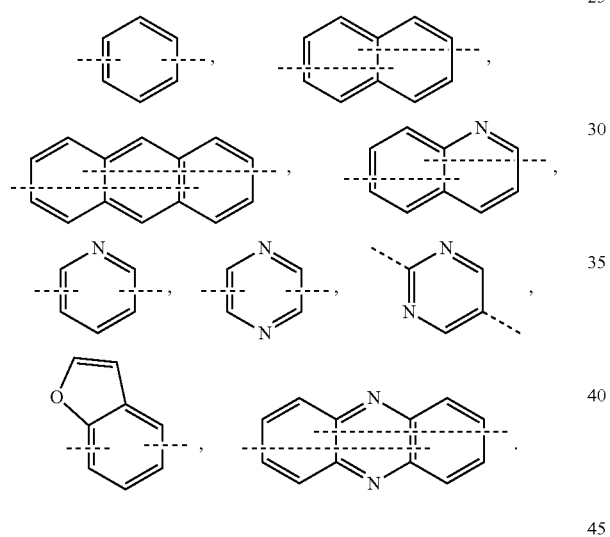

The dashed line represents the linkage site of the group.

In an embodiment, $R_1$, $R_2$, and $R_3$ each is any one independently selected from the following groups, or any one independently selected from the following groups substituted by a substituent:

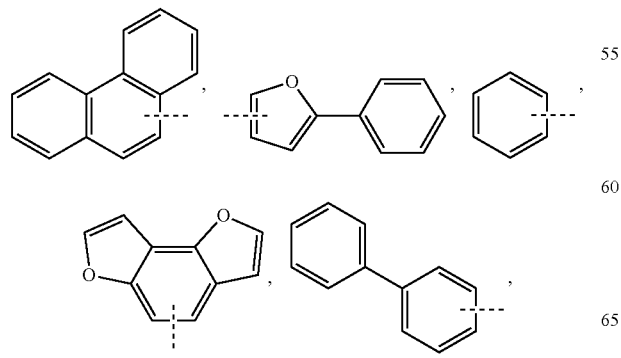

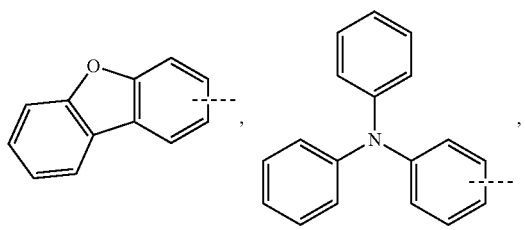

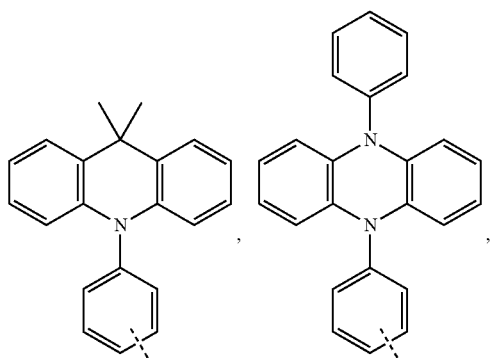

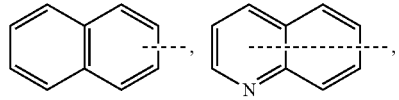

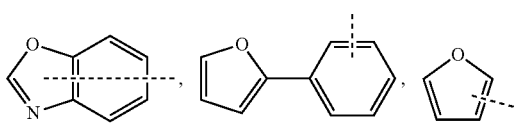

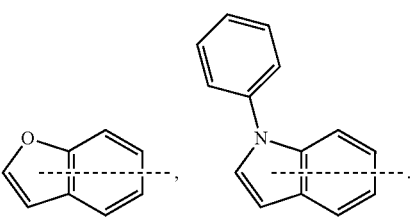

The dashed line represents the linkage site of the group.

The substituent is at least one selected from a group consisting of C1 to C10 (e.g., C2, C3, C4, C5, C6, C7, C8, or C9) linear or branched alkyl, C1 to C10 (e.g., C2, C3, C4, C5, C6, C7, C8, or C9) alkoxy, and C1 to C10 (e.g., C2, C3, C4, C5, C6, C7, C8, or C9) thioalkoxy.

In an embodiment, the electroluminescent compound is any one selected from the following compounds M1 to M50:
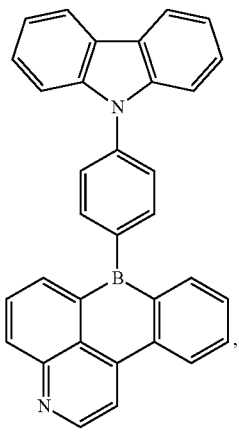
M1
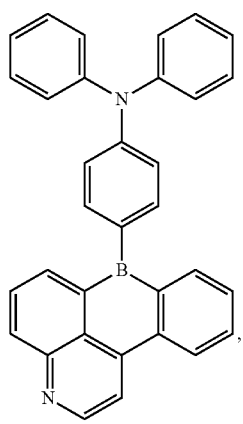
M2
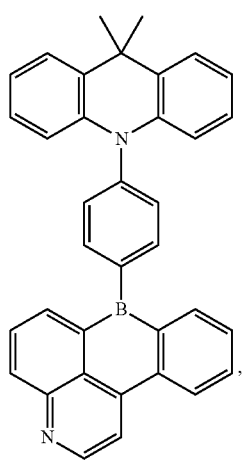
M3
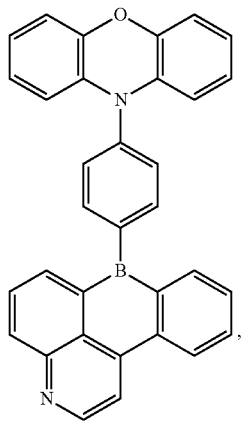
M4
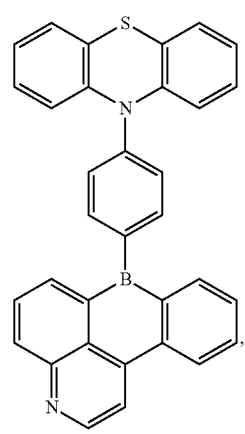
M5
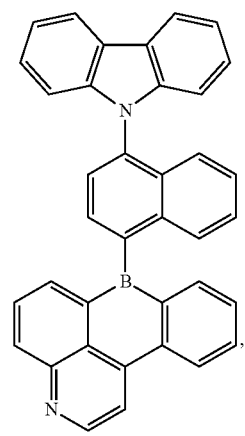
M6

M7
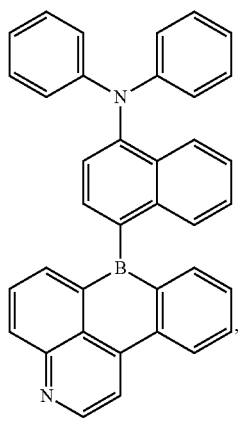
M8
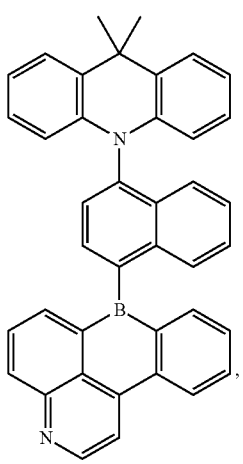
M9
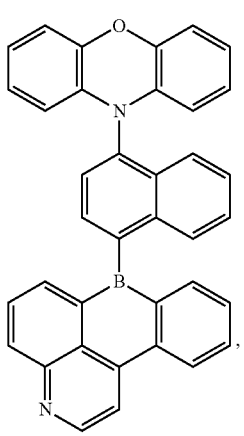
M10
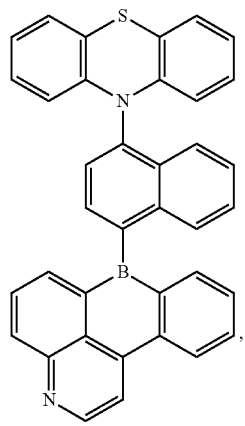
M11
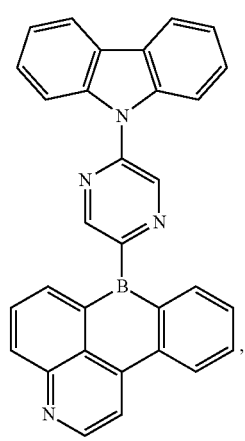
M12
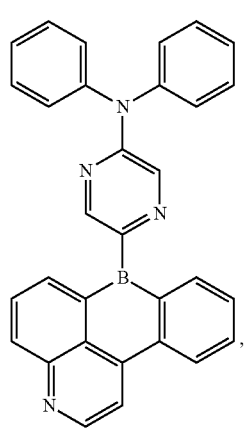

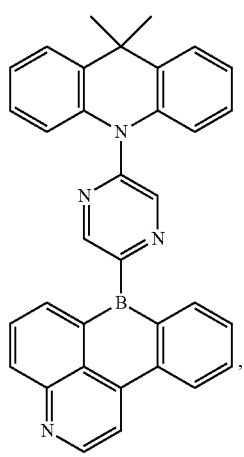 M13
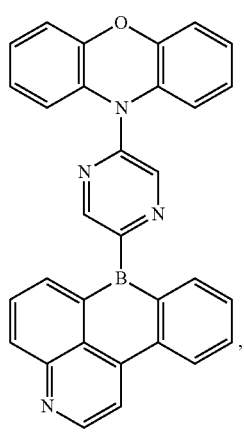 M14
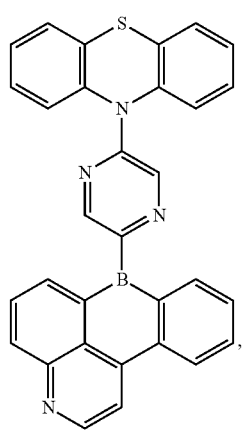 M15
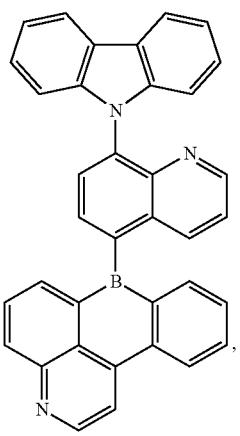 M16
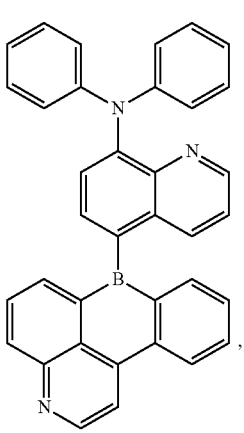 M17
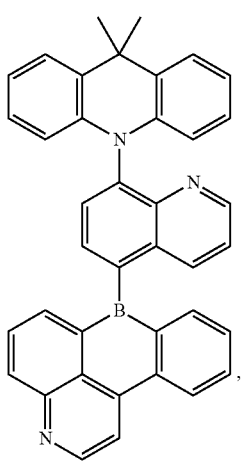 M18

17
-continued
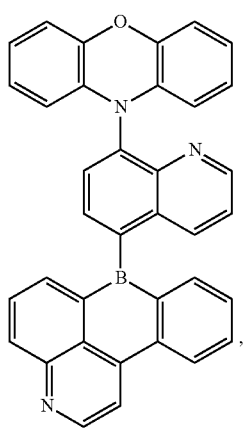
M19
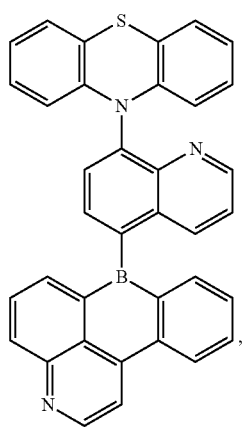
M20
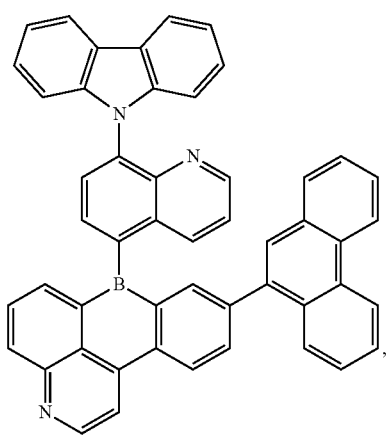
M21
18
-continued
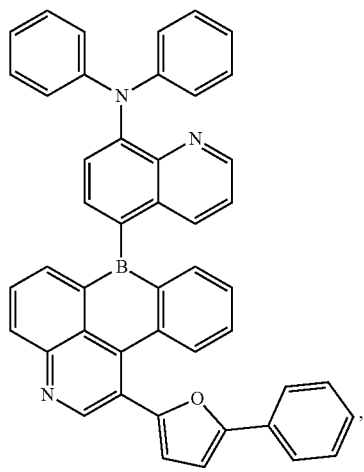
M22
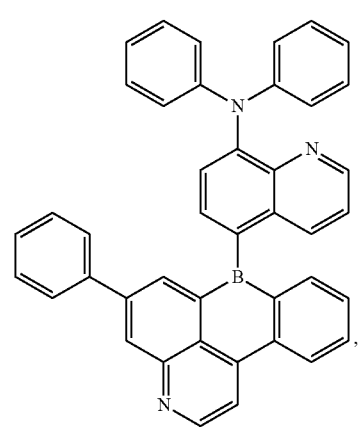
M23
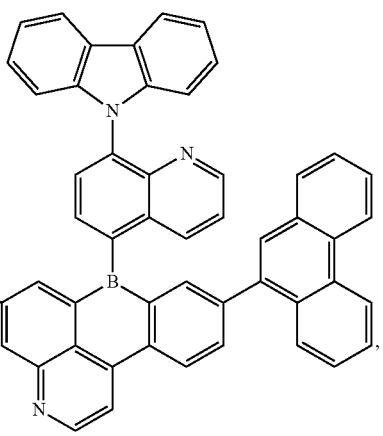
M24

M25
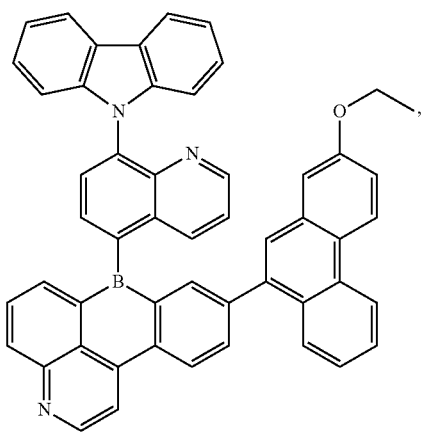
M26
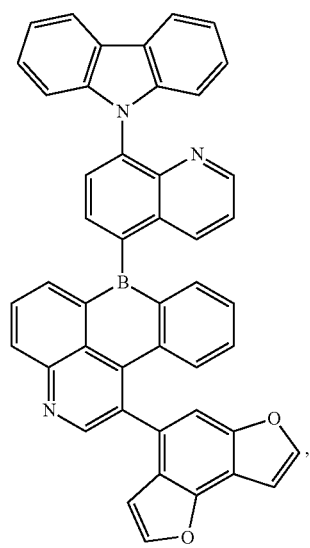
M27
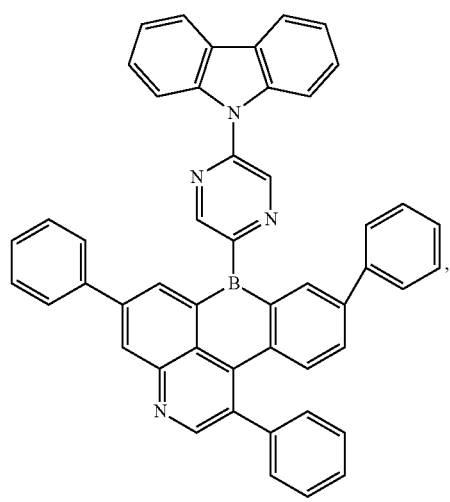
M28
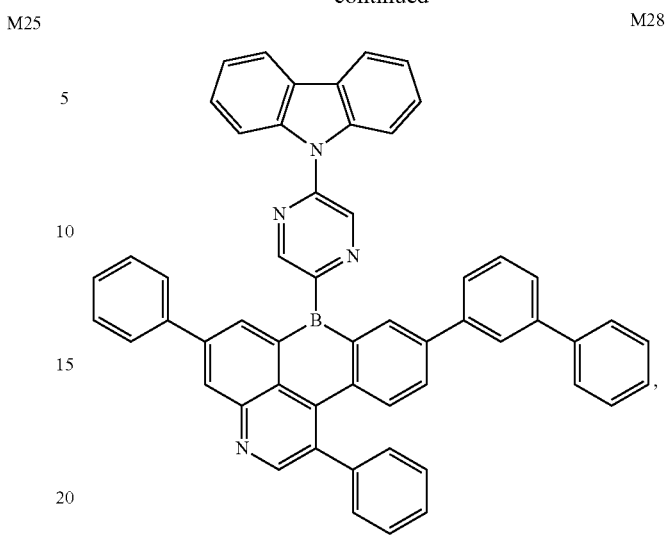
M29
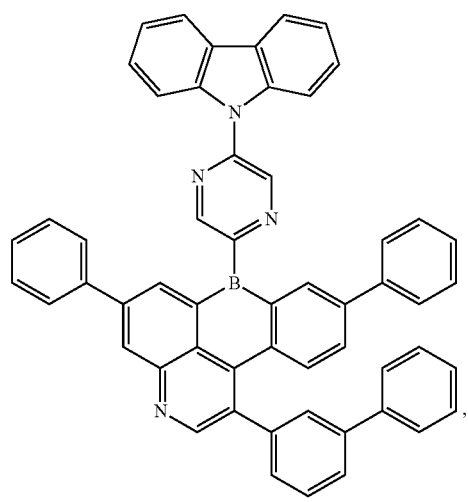
M30
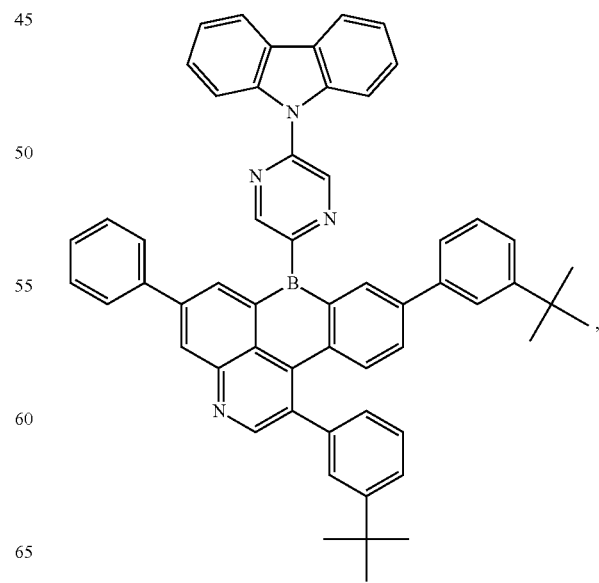

M31
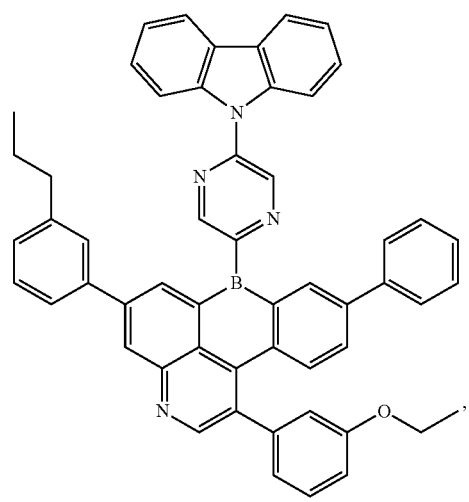
M32
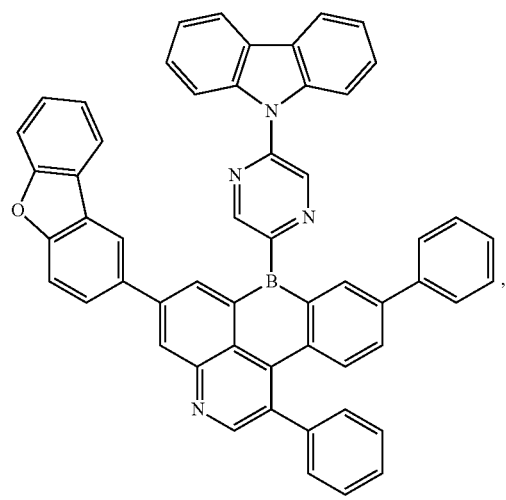
M33
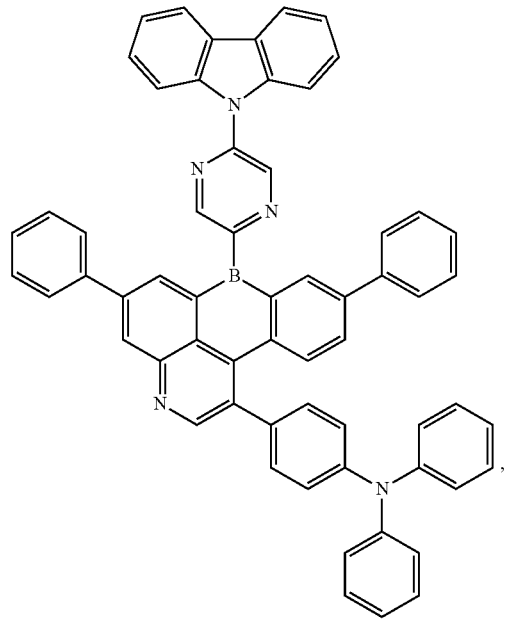
M34
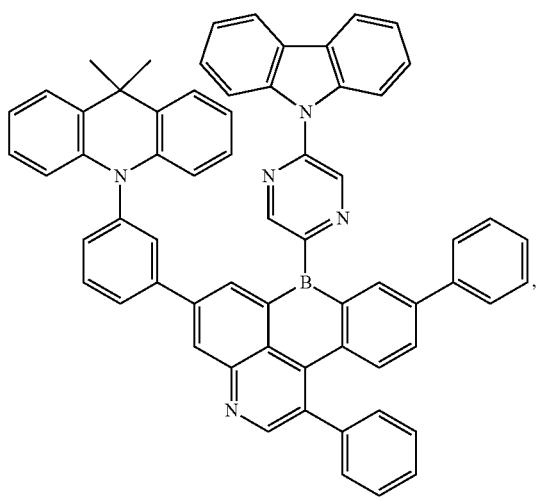
M35
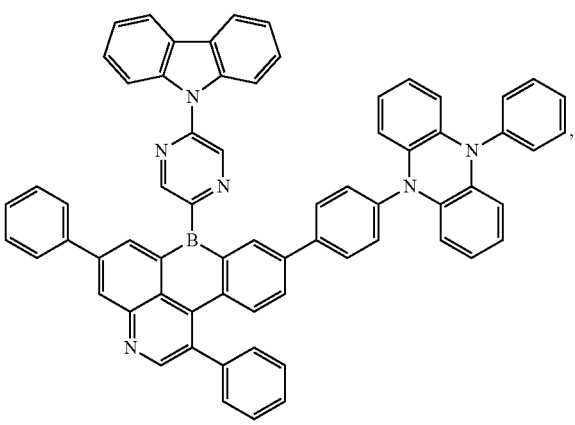
M36
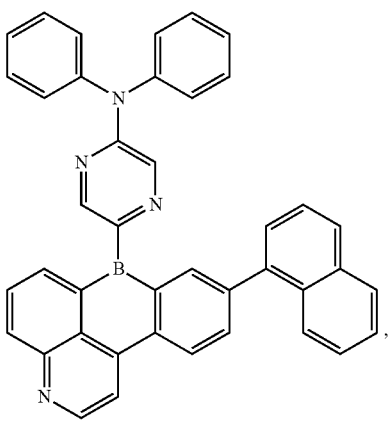

M37
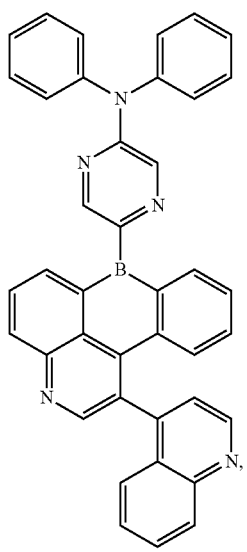
M38
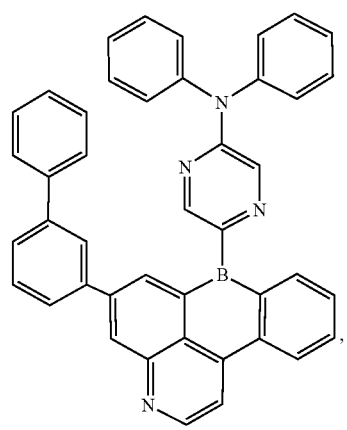
M39
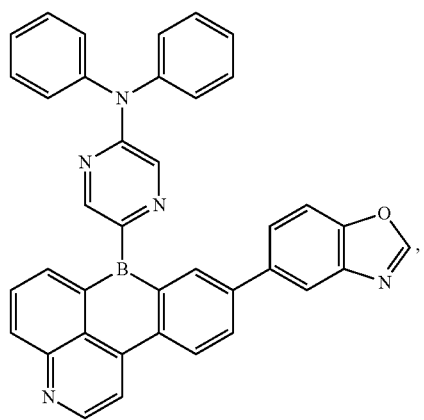
M40
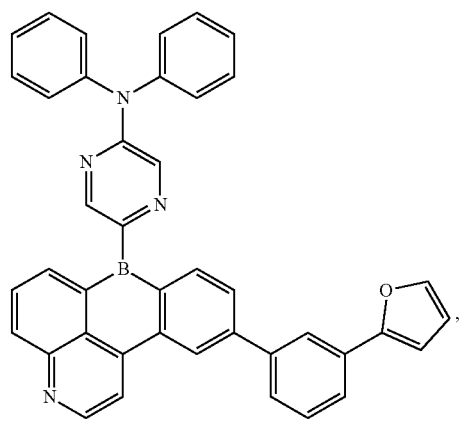
M41
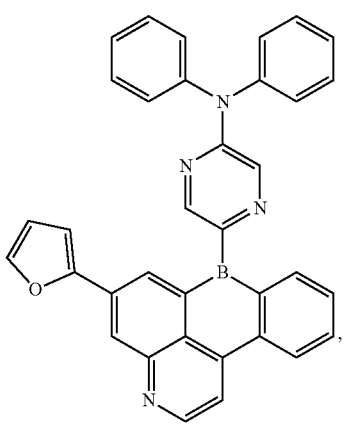
M42
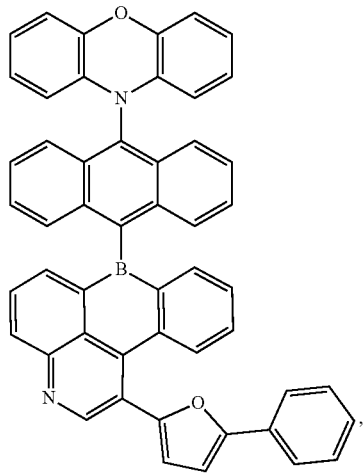

-continued
M43
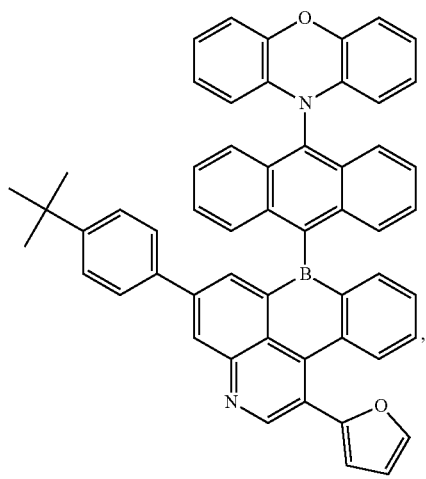
M46
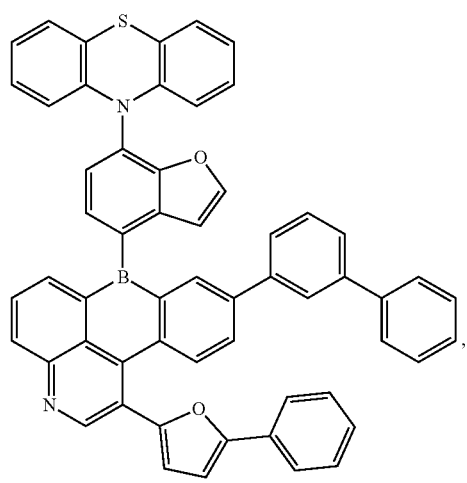
M44
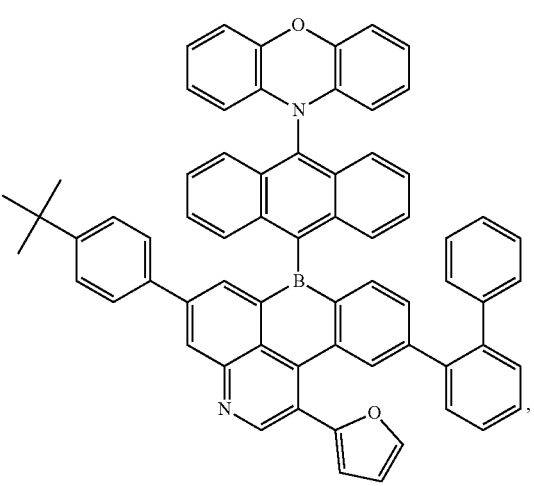
M47
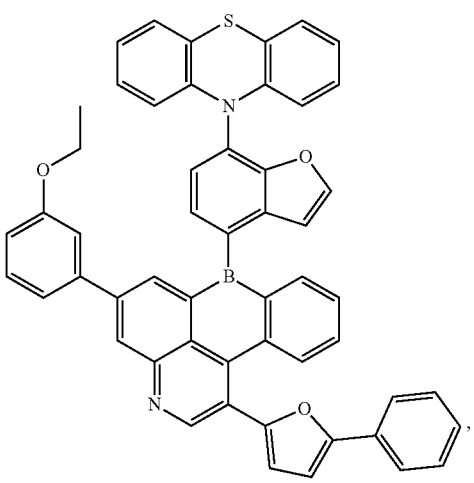
M45
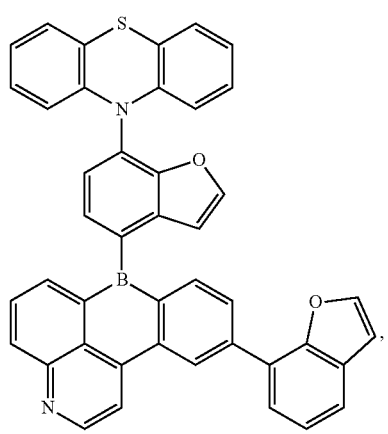
M48

-continued

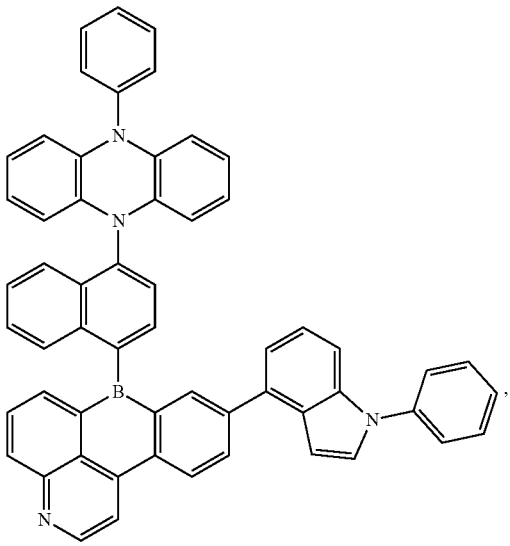

M49

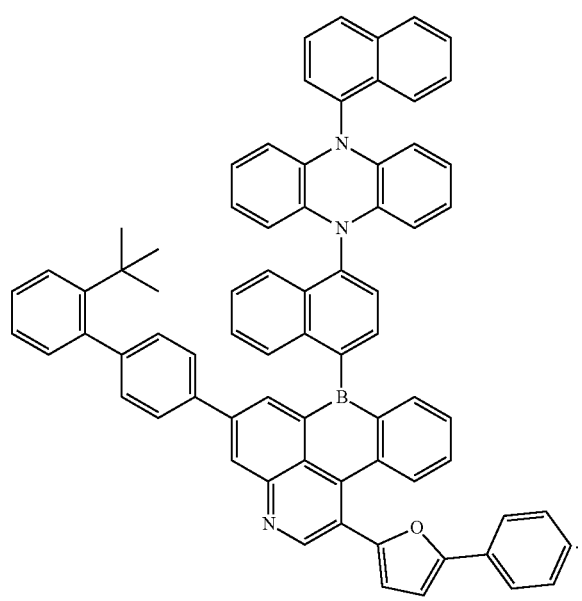

M50

In one embodiment of the present disclosure provides a thermally activated delayed fluorescence material including any one of or a combination of at least two of the electroluminescent compounds described above.

In an embodiment, the thermally activated delayed fluorescence material has an energy level difference between the lowest singlet state $S_1$ and the lowest triplet state $T_1$ of $\Delta E_{ST}=E_{S1}-E_{T1} \leq 0.30$ eV, for example, the energy level difference $\Delta E_{ST}$ is 0.29 eV, 0.27 eV, 0.25 eV, 0.24 eV, 0.23 eV, 0.22 eV, 0.21 eV, 0.20 eV, 0.19 eV, 0.18 eV, 0.16 eV, 0.14 eV, 0.13 eV, 0.12 eV, 0.11 eV, 0.10 eV, 0.09 eV, 0.08 eV, 0.07 eV, 0.06 eV, 0.05 eV, 0.04 eV, 0.03 eV, 0.02 eV, or 0.01 eV.

In one embodiment of the present disclosure provides a display panel including an OLED device, and the OLED device includes an anode, a cathode, and at least one organic thin film layer between the anode and the cathode, and the organic thin film layer includes a light emitting layer.

The light emitting layer includes the thermally activated delayed fluorescence material described above, and the thermally activated delayed fluorescence material is used as any one of a host material, a guest material, or a co-doping material.

In an embodiment, the organic thin film layer further includes any one of or a combination of at least two of a hole transport layer, a hole injection layer, an electron blocking layer, a hole blocking layer, an electron transport layer, and an electron injection layer.

In the OLED device of the present disclosure, the material of the anode may be a metal, a metal oxide, or a conductive polymer. The metal includes copper, gold, silver, iron, chromium, nickel, manganese, palladium, platinum, and alloys thereof. The metal oxide includes indium tin oxide (ITO), indium zinc oxide (IZO), zinc oxide, indium gallium zinc oxide (IGZO), and the like. The conductive polymer includes polyaniline, polypyrrole, poly(3-methylthiophene), and the like. In addition to the above materials and combinations thereof which are helpful for hole injection, materials known to be suitable for use as an anode are also included.

In the OLED device, the material of the cathode may be a metal or a multi-layer metal material. The metal includes aluminum, magnesium, silver, indium, tin, titanium, and alloys thereof. The multi-layer metal material includes LiF/Al, $LiO_2$/Al, $BaF_2$/Al, and the like. In addition to the above materials and combinations thereof which are helpful for electron injection, materials known to be suitable for use as a cathode are also included.

In the OLED device, the organic thin film layer includes at least one light emitting layer (EML) and any one of or a combination of at least two of a hole transport layer (HTL), a hole injection layer (HIL), an electron blocking layer (EBL), a hole blocking layer (HBL), an electron transport layer (ETL), and an electron injection layer (EIL) which is(are) disposed on two sides of the light emitting layer, and the hole/electron injection and transport layers may be carbazole compounds, arylamine compounds, benzimidazole compounds, metal compounds, and the like.

A schematic diagram of the OLED device is shown in FIG. 1, and the OLED device includes an anode 101 and a cathode 102, a light emitting layer 103 disposed between the anode 101 and the cathode 102, and a first organic thin film 104 and a second organic thin film 105 are disposed on two sides of the light emitting layer 103. The first organic thin film 104 and the second organic thin film 105 each is independently any one of or a combination of at least two of a hole transport layer (HTL), a hole injection layer (HIL), an electron blocking layer (EBL), a hole blocking layer (HBL), an electron transport layer (ETL), and an electron injection layer (EIL).

The OLED device may be prepared by forming an anode on a transparent or opaque smooth substrate, forming an organic thin layer(s) on the anode, and forming a cathode on the organic thin layer(s). The organic thin layer(s) may be formed by known film formation methods such as evaporation, sputtering, spin coating, impregnation, and ion plating.

In one embodiment of the present disclosure provides an electronic apparatus including the display panel described above.

The compound with the structure represented by Formula I provided by the present disclosure is exemplarily prepared by the following synthetic route:

US 11,539,004 B2

29

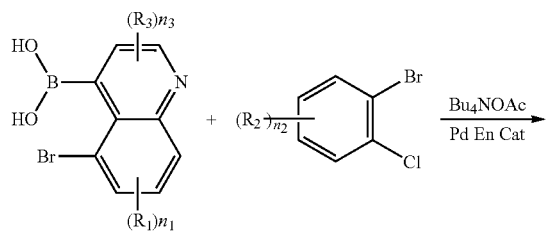

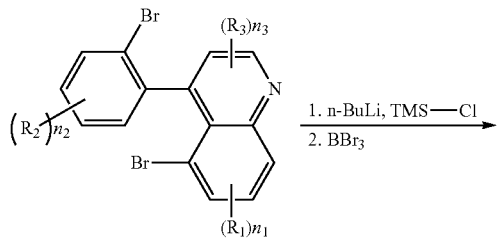

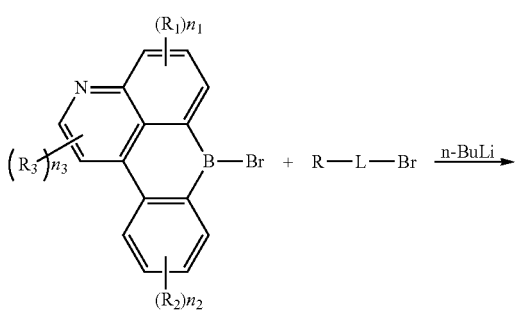

and R, R$_1$, R$_2$, R$_3$, L, n$_1$, n$_2$, and n$_3$ each independently has the same definition as in Formula I, and TMS is trimethylsilyl.

Example 1

This example provides an electroluminescent compound with the following structure:

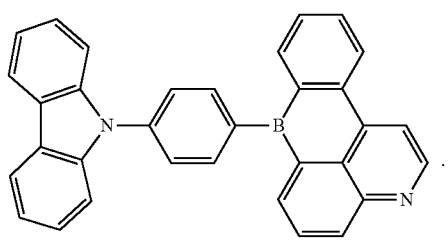

M1

30

The preparation method includes steps described below.

(1)

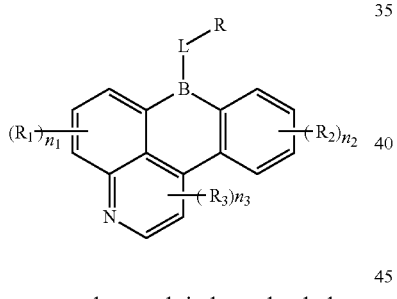

In a microwave vial, A (0.5 mmol) and B (0.5 mmol) were sequentially added and dissolved in ethanol (6 mL), and then Bu$_4$NOAc (1 mmol) and Pd En Cat (63 mg, 5 mol %) were added. The reaction was irradiated at 120° C. for 10 min using a microwave device. After being cooled to room temperature in the microwave cavity, the reaction mixture was purified on a SCXII column using dichloromethane (DCM, 10 mL) as eluent, and evaporated to dryness to obtain Intermediate C.

$^1$H-NMR (400 MHz, CDCl$_3$): δ 8.91 (s, 1H), 8.12 (d, J=4.0 Hz, 2H), 7.84 (s, 1H), 7.66 (s, 1H), 7.53 (s, 1H), 7.44 (s, 1H), 7.32 (d, J=20.0 Hz, 2H).

$^{13}$C-NMR (100 MHz, CDCl$_3$); δ 148.63 (s), 148.12 (s), 147.36 (s), 143.88 (s), 134.18 (s), 132.82 (s), 131.31 (s), 130.07 (s), 129.65 (s), 127.95 (s), 127.51 (s), 126.95 (s), 120.99 (s), 119.91 (s), 118.80 (s).

(2)

7.22 g (20 mmol) of Intermediate C was added to a 250 mL three-neck flask, dissolved in tetrahydrofuran (THF) (80 mL), and purged with nitrogen three times. After being cooled to −78° C., the temperature was controlled below −65° C. and 20 mL of π-butyllithium (n-BuLi, 50 mmol) was dropwise added slowly. After the addition, the mixture was stirred for 30 min. Then 4.35 g of trimethylchlorosilane (TMS-Cl, 40 mmol) was dropwise added slowly, and the reaction was raised to 0° C. for 4 h. Then the reaction was quenched with ice water and extracted with DCM. The organic phases were collected and evaporated on a rotary evaporator to obtain a light yellow oil which was crystallized from a mixed solvent of toluene and ethanol to obtain a light yellow solid. The light yellow solid, 70 mL of anhydrous toluene solution, and 0.76 mL (8 mmol) of boron tribromide were sequentially added to a 200 mL tank and stirred at 120° C. for 12 h. Then the reaction was quenched with H$_2$O (100 mL) and extracted with DCM. The organic phases were collected, dried and filtered, and evaporated on a rotary evaporator to remove the solvent. The residue was crystallized from a mixed solvent of dichloromethane and ethanol to obtain Intermediate D.

$^1$H-NMR (400 MHz, CDCl$_3$): δ 8.87 (s, 1H), 8.56 (s, 1H), 8.17 (s, 1H), 7.94 (s, 2H), 7.77 (s, 1H), 7.59 (s, 1H), 7.50 (s, 1H), 7.42 (s, 1H).

$^{13}$C-NMR (100 MHz, CDCl$_3$): δ 152.83 (s), 152.33 (s), 142.66 (s), 137.45 (s), 133.10 (s), 132.00 (s), 130.42 (s), 129.95 (s), 129.74 (s), 128.11 (s), 127.38 (s), 125.83 (s), 111.38 (s).

(3)

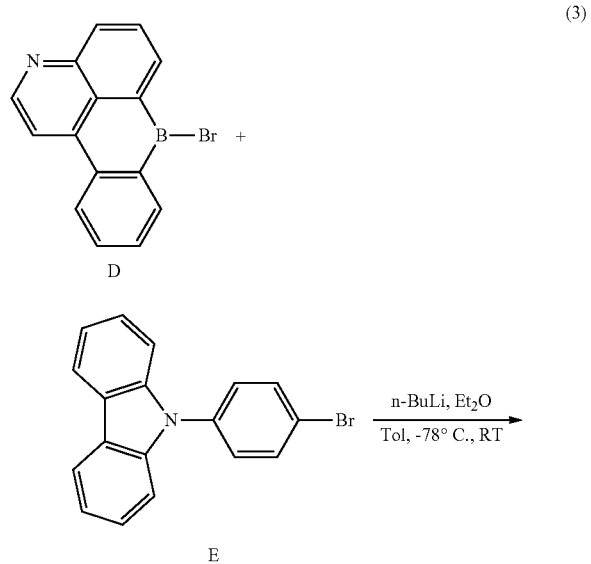

6.16 g (19.13 mmol) of Compound E, 9-(4-bromophenyl)carbazole, was added to a reaction flask, dissolved in ether (50 mL) and purged with nitrogen three times. After being cooled to −78° C., the temperature was controlled below −65° C. and 8.04 mL (2.5 M, 20.09 mmol) of n-BuLi was added slowly. After the addition, the reaction was stirred for 30 min. 4.4 g (15 mmol) of Intermediate D was dissolved in toluene (Tol, 60 mL) and then slowly added to the reaction solution. After the addition, the reaction was naturally increased to room temperature for 6 h. Then the reaction was quenched with ice water (100 mL), extracted with DCM, and finally, extracted once with saturated saline. The organic phases were collected and evaporated on a rotary evaporator to obtain a light yellow oil. The product was purified by a column chromatography method (mobile phase: a mixed solvent of π-hexane and dichloromethane at a volume ratio of 3:1) to obtain a target product M1.

$^1$H-NMR (400 MHz, CDCl$_3$): δ 8.87 (s, 1H), 8.63 (s, 1H), 8.55 (s, 1H), 8.18 (d, J=8.0 Hz, 2H), 7.94 (s, 2H), 7.89 (s, 2H), 7.75 (d, J=16.0 Hz, 3H), 7.59 (s, 1H), 7.51 (d, J=8.0 Hz, 2H), 7.41 (d, J=8.0 Hz, 2H), 7.16 (dd, J=22.0, 14.0 Hz, 4H).

$^{13}$C-NMR (100 MHz, CDCl$_3$): δ 154.08 (s), 151.64 (s), 149.09 (s), 145.60 (s), 139.35 (s), 135.38 (s), 135.09 (s), 134.82 (s), 131.99 (s), 130.97 (s), 129.86-129.49 (m), 127.77 (d, J=9.8 Hz), 126.91 (s), 125.67 (s), 125.32 (s), 121.91 (s), 121.15 (d, J=2.7 Hz), 114.95 (s), 113.74 (s).

Example 2

This example provides an electroluminescent compound with the following structure:

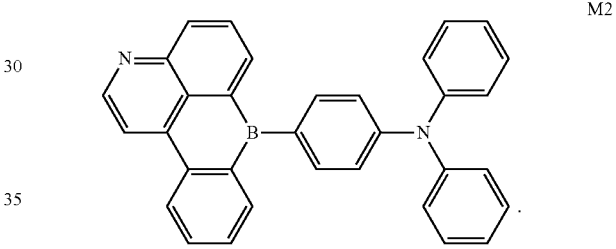

This preparation method differed from the preparation method in Example 1 in that the compound E in step (3) was replaced with an equal molar amount of Compound E2

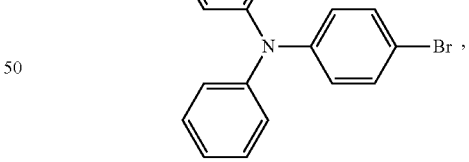

and the other preparation conditions remained unchanged to obtain a target product M2.

$^1$H-NMR (400 MHz, CDCl$_3$): δ 8.87 (s, 1H), 8.63 (s, 1H), 8.55 (s, 1H), 8.18 (d, J=8.0 Hz, 2H), 7.94 (s, 4H), 7.89 (s, 4H), 7.75 (d, J=16.0 Hz, 3H), 7.59 (s, 1H), 7.51 (d, J=8.0 Hz, 2H), 7.41 (d, J=8.0 Hz, 2H), 7.16 (dd, J=22.0, 14.0 Hz, 4H).

$^{13}$C-NMR (100 MHz, CDCl$_3$): δ 154.08 (s), 151.67 (d, J=7.0 Hz), 146.93 (s), 145.60 (s), 139.35 (s), 135.09 (s), 134.01 (s), 131.99 (s), 130.97 (s), 129.86-129.49 (m), 129.27 (s), 127.82 (s), 127.11 (s), 126.91 (s), 125.32 (s), 124.67 (s), 122.99 (s), 113.74 (s).

Example 3

This example provides an electroluminescent compound with the following structure:

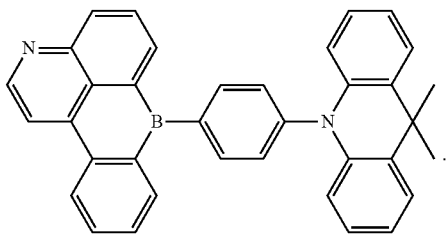

M3

This preparation method differed from the preparation method in Example 1 in that the compound E in step (3) was replaced with an equal molar amount of Compound E3

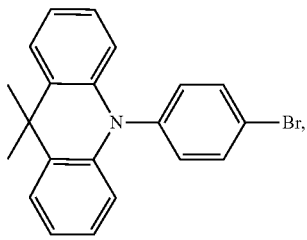 [SMILES: CC1(C)c2ccccc2N(c2ccc(Br)cc2)c2ccccc21]

and the other preparation conditions remained unchanged to obtain a target product M3.

$^1$H-NMR (400 MHz, CDCl$_3$): δ 8.87 (s, 1H), 8.62 (s, 1H), 8.17 (s, 1H), 7.94 (s, 1H), 7.74 (d, J=24.0 Hz, 3H), 7.55 (d, J=36.0 Hz, 2H), 7.42 (s, 1H), 7.18 (dd, J=8.0, 4.0 Hz, 8H), 6.94 (s, 2H), 1.69 (s, 6H).

$^{13}$C-NMR (100 MHz, CDCl$_3$): δ 154.08 (s), 152.78 (s), 151.64 (s), 145.60 (s), 142.44 (s), 139.35 (s), 135.09 (s), 134.24 (s), 133.37 (s), 131.99 (s), 130.97 (s), 29.86-129.49 (m), 128.95 (s), 127.82 (s), 127.11 (s), 126.83 (d, J=15.7 Hz), 125.32 (s), 122.86 (s), 120.00 (s), 113.74 (s), 35.71 (s), 29.68 (s).

Example 4

This example provides an electroluminescent compound with the following structure:

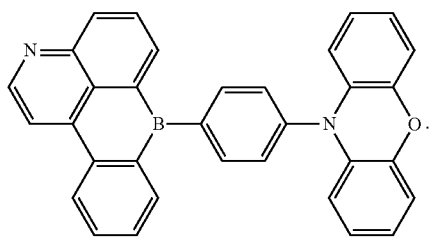

M4

This preparation method differed from the preparation method in Example 1 in that the compound E in step (3) was replaced with an equal molar amount of Compound E4

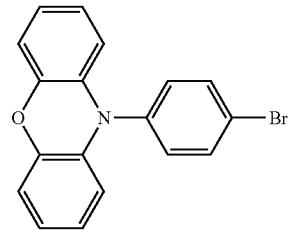 [SMILES: Brc1ccc(N2c3ccccc3Oc3ccccc32)cc1]

and the other preparation conditions remained unchanged to obtain a target product M4.

$^1$H-NMR (400 MHz, CDCl$_3$): δ 8.87 (s, 1H), 8.64 (s, 1H), 8.17 (s, 1H), 7.94 (s, 1H), 7.74 (d, J=24.0 Hz, 3H), 7.55 (d, J=36.0 Hz, 2H), 7.42 (s, 1H), 7.27-7.00 (m, 6H), 6.98 (s, 2H), 6.93 (s, 2H).

$^{13}$C-NMR (100 MHz, CDCl$_3$): δ 154.08 (s), 152.78 (s), 151.64 (s), 146.79 (s), 145.60 (s), 139.35 (s), 135.09 (s), 134.24 (s), 132.27 (s), 131.99 (s), 130.97 (s), 129.86-129.49 (m), 127.82 (s), 127.11 (s), 126.91 (s), 125.32 (s), 123.59 (d, J=16.4 Hz), 119.00 (s), 116.41 (s), 113.74 (s).

Example 5

This example provides an electroluminescent compound with the following structure:

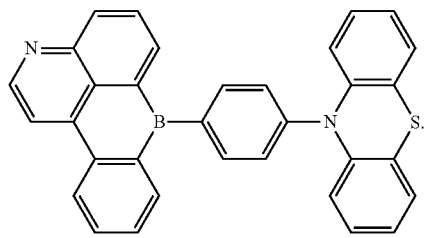

M5

This preparation method differed from the preparation method in Example 1 in that the compound E in step (3) was replaced with an equal molar amount of Compound E5

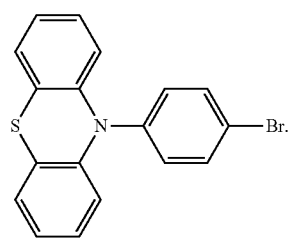 [SMILES: Brc1ccc(N2c3ccccc3Sc3ccccc32)cc1]

and the other preparation conditions remained unchanged to obtain a target product M5.

$^1$H-NMR (400 MHz, CDCl$_3$): δ 8.87 (s, 1H), 8.64 (s, 1H), 8.17 (s, 1H), 7.94 (s, 1H), 7.74 (d, J=24.0 Hz, 3H), 7.55 (d, J=36.0 Hz, 2H), 7.42 (s, 1H), 7.25-7.06 (m, 8H), 6.97 (s, 2H).

$^{13}$C-NMR (100 MHz, CDCl$_3$): δ 154.08 (s), 152.78 (s), 151.64 (s), 145.60 (s), 141.45 (s), 139.35 (s), 135.09 (s), 134.24 (s), 131.99 (s), 130.97 (s), 129.86-129.49 (m), 127.82 (s), 127.22-127.01 (m), 126.91 (s), 126.62 (s), 125.32 (s), 124.39 (s), 122.70 (s), 115.74 (s), 113.74 (s).

Example 6

This Example provides an electroluminescent compound with the following structure:

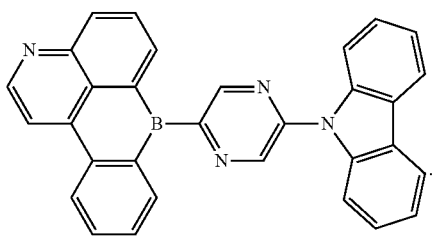

M11

This preparation method differed from the preparation method in Example 1 in that the compound E in step (3) was replaced with an equal molar amount of Compound E11

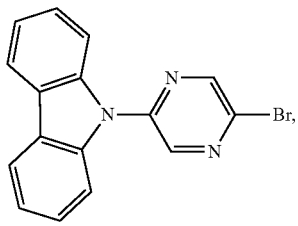 [SMILES: Brc1cnc(-n2c3ccccc3c3ccccc32)cn1]

and the other preparation conditions remained unchanged to obtain a target product M11.

$^1$H-NMR (400 MHz, CDCl$_3$): δ 9.96 (s, 1H), 8.87 (s, 1H), 8.59 (d, J=30.8 Hz, 2H), 8.18 (d, J=8.0 Hz, 2H), 7.94 (s, 1H), 7.77 (s, 3H), 7.71-7.29 (m, 3H), 7.41 (d, J=8.0 Hz, 2H), 7.41 (d, J=8.0 Hz, 2H), 7.16 (dd, J=22.0, 14.0 Hz, 2H).

$^{13}$C-NMR (100 MHz, CDCl$_3$): δ 154.08 (s), 151.64 (s), 146.81 (s), 145.60 (s), 139.95 (s), 137.03 (s), 135.23 (s), 134.62 (s), 134.27 (s), 132.22 (s), 131.39 (s), 129.98 (s), 129.61 (d, J=2.1 Hz), 127.35 (d, J=18.4 Hz), 126.10 (s), 125.05 (s), 122.16 (s), 120.90 (s), 116.82 (s), 113.74 (s).

Application Example 1

This application example provided an OLED device. The OLED device included a substrate, an ITO anode, a hole injection layer, a hole transport layer, a light emitting layer, a first electron transport layer, a second electron transport layer, a cathode (a magnesium-silver electrode with a magnesium:silver mass ratio of 9:1), and a capping layer (CPL) in sequence. The ITO anode had a thickness of 15 nm, the hole injection layer had a thickness of 10 nm, the hole transport layer had a thickness of 110 nm, the light emitting layer had a thickness of 30 nm, the first electron transport layer had a thickness of 30 nm, the second electron transport layer had a thickness of 5 nm, the magnesium-silver electrode had a thickness of 15 nm, and the capping layer (CPL) had a thickness of 100 nm.

The OLED device was prepared by steps described below.
(1) A glass substrate was cut into a size of 50 mm×50 mm×0.7 mm, sonicated in isopropanol and deionized water for 30 min, separately, and washed in ozone for 10 min. The obtained glass substrate with an ITO anode was mounted on a vacuum deposition apparatus.

(2) Under a vacuum degree of 2×10$^{-6}$ Pa, a thickness of 10 nm of a hole injection layer material HAT-CN was deposited on the ITO anode by vacuum evaporation.

(3) A thickness of 110 nm of TAPC was deposited on the hole injection layer by vacuum evaporation to serve as a hole transport layer.

(4) A thickness of 30 nm of a light emitting layer was co-deposited on the hole transport layer, and the electroluminescent compound M1 provided in Example 1 of the present disclosure was used as a doping material of the light emitting layer, and 3,3'-bis(N-carbazolyl)-1,1'-biphenyl (mCBP) was used as a host material of the light emitting layer, and the mass ratio of M1 to mCBP was 1:9.

(5) A thickness of 30 nm of TPBi was deposited on the light emitting layer by vacuum evaporation to serve as a first electron transport layer.

(6) A thickness of 5 nm of Alq3 was deposited on the first electron transport layer by vacuum evaporation to serve as a second electron transport layer.

(7) A thickness of 15 nm of a magnesium-silver electrode was deposited on the second electron transport layer by vacuum evaporation to serve as a cathode.

(8) A thickness of 100 nm of CBP was deposited on the cathode by vacuum evaporation to serve as a cathode covering layer (a capping layer).

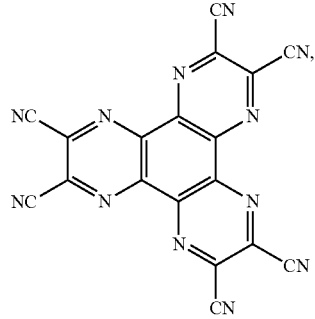

HAT-CN

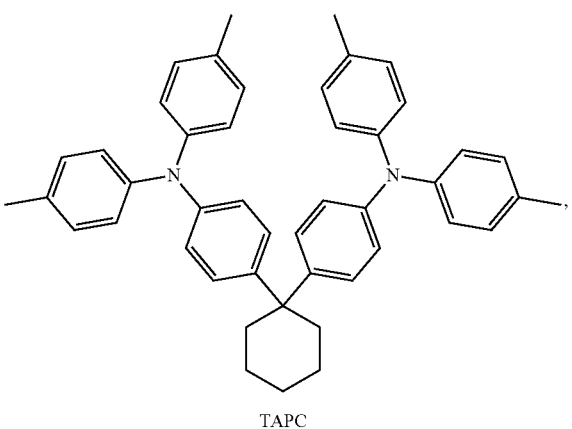

TAPC

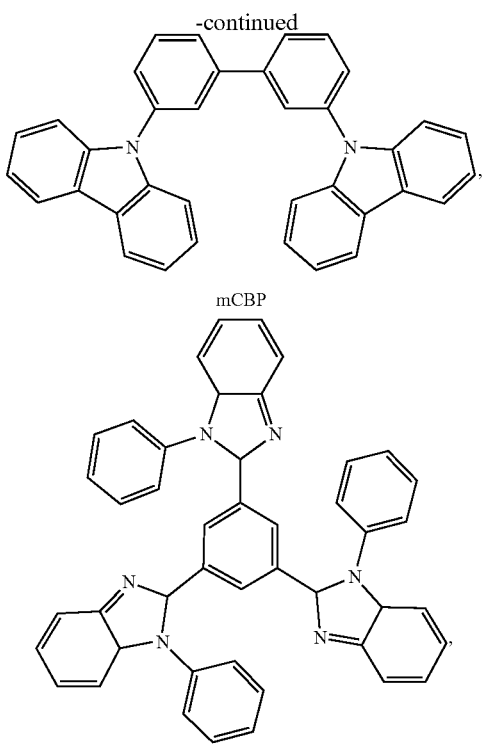

mCBP

TPBi

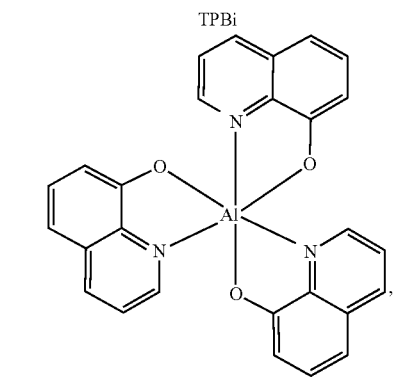

Alq3

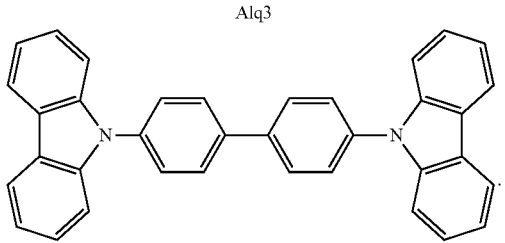

CBP

Application Example 2

This application example differed from Application Example 1 in that M1 in step (4) was replaced with an equal amount of M2.

Application Example 3

This application example differed from Application Example 1 in that M1 in step (4) was replaced with an equal amount of M3.

Application Example 4

This application example differed from Application Example 1 in that M1 in step (4) was replaced with an equal amount of M4.

Application Example 5

This application example differed from Application Example 1 in that M1 in step (4) was replaced with an equal amount of M5.

Application Example 6

This application example differed from Application Example 1 in that M1 in step (4) was replaced with an equal amount of M11.

Comparative Example 1

This comparative example differed from Application Example 1 in that M1 in step (4) was replaced by an equal amount of Comparative Compound BczVBi

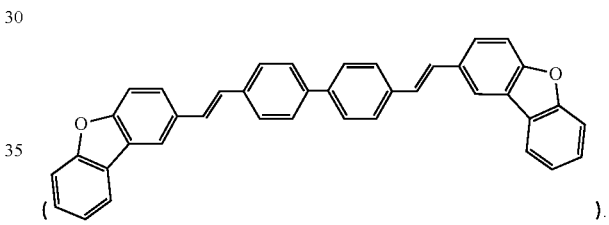

Comparative Example 2

This comparative example differed from Application Example 1 in that M1 in step (4) was replaced with an equal amount of Comparative Compound 1

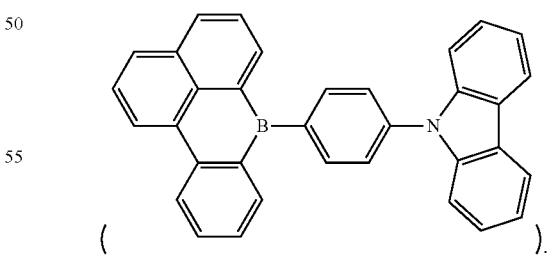

Comparative Example 3

This Comparative Example differed from Application Example 1 in that M1 in step (4) was replaced with an equal amount of Comparative Compound 2

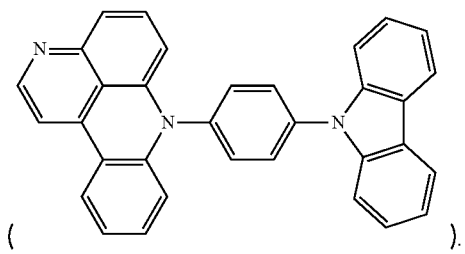

Performance Test
(1) Simulated Calculations of Compounds

The energy level difference between the singlet state and the triplet state of an electroluminescent compound may be obtained by Guassian 09 software (Guassian Inc.). For a specific simulation method of the energy level difference $\Delta E_{ST}$, reference may be made to J. Chem. Theory Comput., 2013, DOI: 10.1021/ct400415r, and molecular structure optimization and excitation may be completed by a TD-DFT method "B3LYP" and a basic set "6-31 g (d)". The electroluminescent compounds M1, M2, M3, M4, M5, and M11 provided by the present disclosure and BczVBi were simulated according to the above-mentioned methods, and results are shown in Table 1.

(2) Simulation of Orbital Arrangements of the Compound

Figure 2:
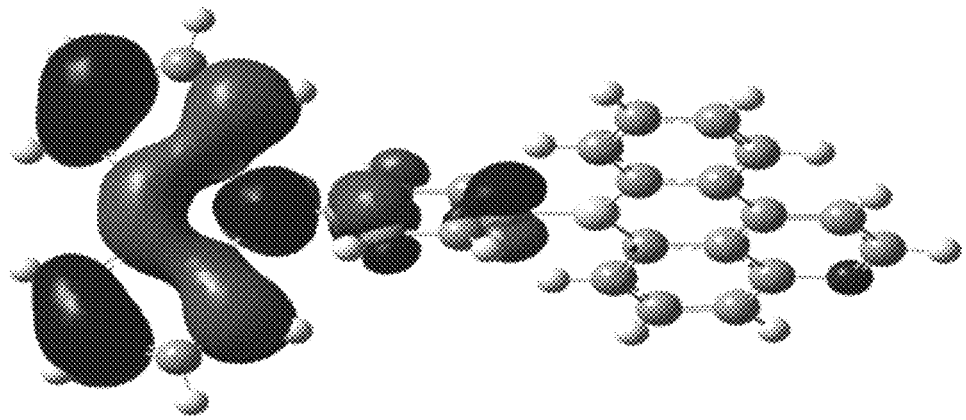
FIG. 2 is the HOMO orbital arrangement diagram of the electroluminescent compound M1 provided in Example 1 of the present disclosure.
Figure 3:
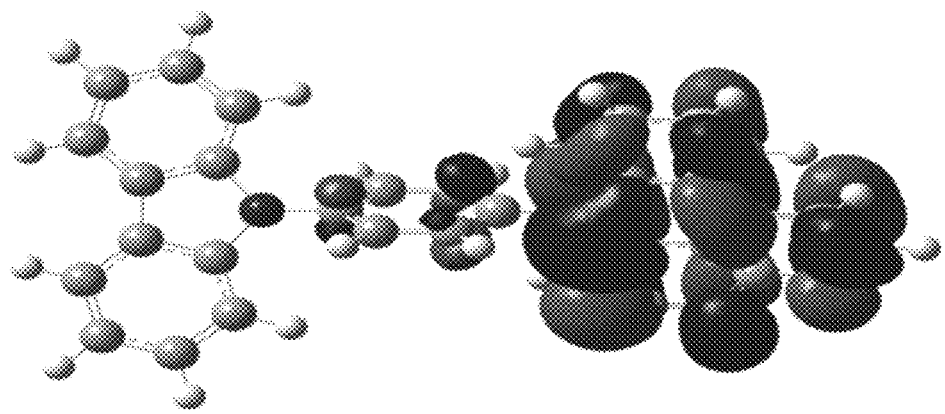
FIG. 3 is the LUMO orbital arrangement diagram of the electroluminescent compound M1 provided in Example 1 of the present disclosure.

Orbital arrangement diagrams of the electroluminescent compound M1 provided by the present disclosure were simulated according to a method in the existing art, for example, reference is made to Furche F, Ahlrichs R. Adiabatic time-dependent density functional methods for excited state properties Pt Journal of Chemical Physics, 2002, 117 (16): 7433. The HOMO orbital arrangement diagram of M1 is shown in FIG. 2, and the LUMO orbital arrangement diagram of M1 is shown in FIG. 3. It can be known from a comparison of FIG. 2 and FIG. 3 that the HOMO and the LUMO of M1 are arranged in different regions respectively and separated completely, which is helpful to reduce the inter-system energy difference $\Delta E_{ST}$ and improves the reverse inter-system crossing capability.

TABLE 1

| Compound | HOMO (eV) | LUMO (eV) | $S_1$ (eV) | $T_1$ (eV) | $\Delta E_{ST}$ (eV) | T |
|---|---|---|---|---|---|---|
| M1 | −5.59 | −2.85 | 2.72 | 2.66 | 0.06 | 14.0 μs |
| M2 | −5.01 | −2.44 | 2.57 | 2.50 | 0.07 | 2.2 μs |
| M3 | −4.96 | −2.63 | 2.32 | 2.30 | 0.02 | 2.9 μs |
| M4 | −4.68 | −2.68 | 2.00 | 1.95 | 0.05 | 4.3 μs |
| M5 | −5.23 | −2.49 | 2.45 | 2.41 | 0.04 | 3.8 μs |
| M11 | −5.18 | −2.48 | 2.39 | 2.31 | 0.08 | 6.2 μs |
| BczVBi | −5.90 | −2.81 | 3.03 | 2.46 | 0.57 | 6.3 ns |

It can be known from data in Table 1 that through a special design of the molecular structure of the electroluminescent compounds provided by the present disclosure, $\Delta E_{ST}$ thereof is reduced to less than 0.25 eV or even less than 0.10 eV, so that a small energy level difference between the singlet state and the triplet state is achieved, which is beneficial to reverse inter-system crossing; and the fluorescence lifetime is improved significantly to an order of μs, even 14.0 μs, resulting in a significant delayed fluorescence effect. Compared with BczVBi in the comparative example, the electroluminescent compounds of the present disclosure are more suitable to be used as materials of a light-emitting layer in an OLED device.

(3) Performance Evaluation of the OLED Device

Currents of the OLED devices at different voltages were measured by a Keithley 2365A digital nanometer, and divided by light emitting area to obtain current densities of the OLED devices at different voltages. Brightness and radiative energy flux densities of the OLED devices at different voltages were measured by a Konicaminolta CS-2000 spectroradiometer. According to the current densities and the brightness of the OLED devices at different voltages, current efficiency (Cd/A) and external quantum efficiency (%) at the same current density (10 mA/cm$^2$) were obtained. The turn-on voltage ($V_{turn-on}$), current efficiency (CE), external quantum efficiency (EQE), power efficiency (hp) and chrominance (CIE) coordinate (x, y) of the OLED devices provided in Application Examples 1 to 6 and Comparative Examples 1 to 3 were measured according to the above method. Results are shown in Table 2.

TABLE 2

| Doping Material of the Light Emitting Layer | $V_{turn-on}$ (V) | CE (Cd/A) | hp (lm/W) | EQE (%) | CIE (x, y) |
|---|---|---|---|---|---|
| M1 | 3.5 | 26.95 | 24.18 | 17.83 | (0.16, 0.19) |
| M2 | 3.0 | 19.0 | 19.4 | 16.59 | (0.22, 0.37) |
| M3 | 3.8 | 61.3 | 50.6 | 20.1 | (0.36, 0.55) |
| M4 | 3.0 | 50.7 | 53.1 | 23.4 | (0.68, 0.31) |
| M5 | 3.0 | 48.4 | 50.6 | 19.32 | (0.16, 0.18) |
| M11 | 3.0 | 55.8 | 58.4 | 16.92 | (0.38, 0.58) |
| BczVBi | 3.2 | 4.5 | 5.0 | 4.11 | (0.14, 0.13) |
| Comparative Compound 1 | 4.0 | 8.6 | 6.8 | 5.38 | (0.15, 0.21) |
| Comparative Compound 2 | 4.2 | 9.7 | 7.3 | 7.21 | (0.56, 0.31) |

In can be known from data in Table 2 that compared with the OLED device in Comparative Example 1 using the existing doping material of the light emitting layer, BczVBi, the OLED devices prepared based on the electroluminescent compounds provided in Examples 1 to 6 of the present disclosure as light emitting layer materials have lower turn-on voltages, and higher current efficiency, power efficiency, and external quantum efficiency. The current efficiency of the OLED devices reaches 19.0 to 61.3 Cd/A, the power efficiency reaches 19.4 to 58.4 lm/W, and the external quantum efficiency is higher than 16.59% or even reaches 23.4%. The electroluminescent compounds provided by the present disclosure have higher triplet energy and a smaller energy level difference $\Delta E_{ST}$ through the special design of the molecular structure when used as the material of the light emitting layer in the OLED device, they can effectively improve the efficiency of the device and reduce the turn-on voltage.

The electroluminescent compounds provided by the present disclosure can achieve the emission over the whole visible spectrum through substituent design. According to data about the chrominance (CIE) coordinate (x, y) in Table 2, M1 and M5 may be used as materials of a blue light emitting layer of the OLED device, M2 may be used as a material of a green light emitting layer, M4 may be used as a material of a red light emitting layer, and M3 and M11 may be used as materials of a yellow light emitting layer.

The electroluminescent compound provided by the present disclosure uses boron naphthoquinoline as its core to function as an electron acceptor, which is connected to electron-donating groups R, $R_1$, $R_2$, and $R_3$, so that the electroluminescent compound has TADF characteristics and may emit light by utilizing triplet excitons that are forbidden from transiting in traditional fluorescent molecules, improving device efficiency. In addition, large steric hindrance groups are connected to prevent the compound from aggregation and to prevent conjugate planes from directly accumulating to form i-aggregation or excimers, improving the light emitting efficiency of the device. OLED devices that use compounds without the boron naphthoquinoline core structure as described in the present disclosure (Comparative Compound 1 and Comparative Compound 2) as the doping material of the light emitting layer have an increased turn-on voltage and a reduced light emitting efficiency, which is insufficient to satisfy performance requirements of a high-performance light emitting device.

An applicant has stated that the electroluminescent compound, the thermally activated delayed fluorescence material, and the application thereof of the present disclosure are described through the above-mentioned embodiments, but the present disclosure is not limited to the processes and steps described above, which means that implementation of the present disclosure does not necessarily depend on the processes and steps described above.

What is claimed is:

1. An electroluminescent compound having a structure represented by Formula I:

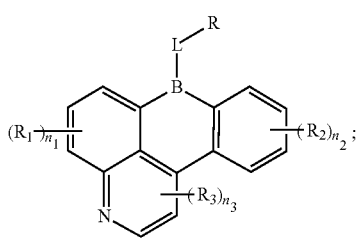

Formula I wherein R, $R_1$, $R_2$, and $R_3$ each is any one independently selected from a group consisting of substituted or unsubstituted C6 to C40 aryl, substituted or unsubstituted C3 to C40 heteroaryl, and substituted or unsubstituted C6 to C30 arylamino, and R, $R_1$, $R_2$, and $R_3$ are electron-donating groups;

when a substituent is present in the above groups R, $R_1$, $R_2$, and $R_3$, the substituent is at least one selected from a group consisting of C1 to C10 linear or branched alkyl, C1 to C10 alkoxy, and C1 to C10 thioalkoxy;

L is C6 to C30 arylene or C3 to C30 heteroarylene;

$n_1$ is an integer from 0 to 3;

$n_2$ is an integer from 0 to 4; and $n_3$ is an integer from 0 to 2.

2. The electroluminescent compound of claim 1, wherein R, $R_1$, $R_2$, and $R_3$ each is any one independently selected from following groups, or any one independently selected from the following groups substituted by a substituent:

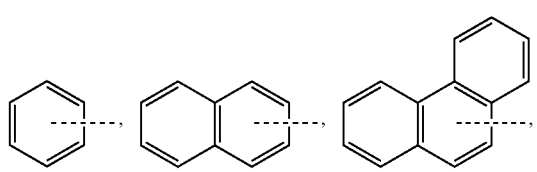

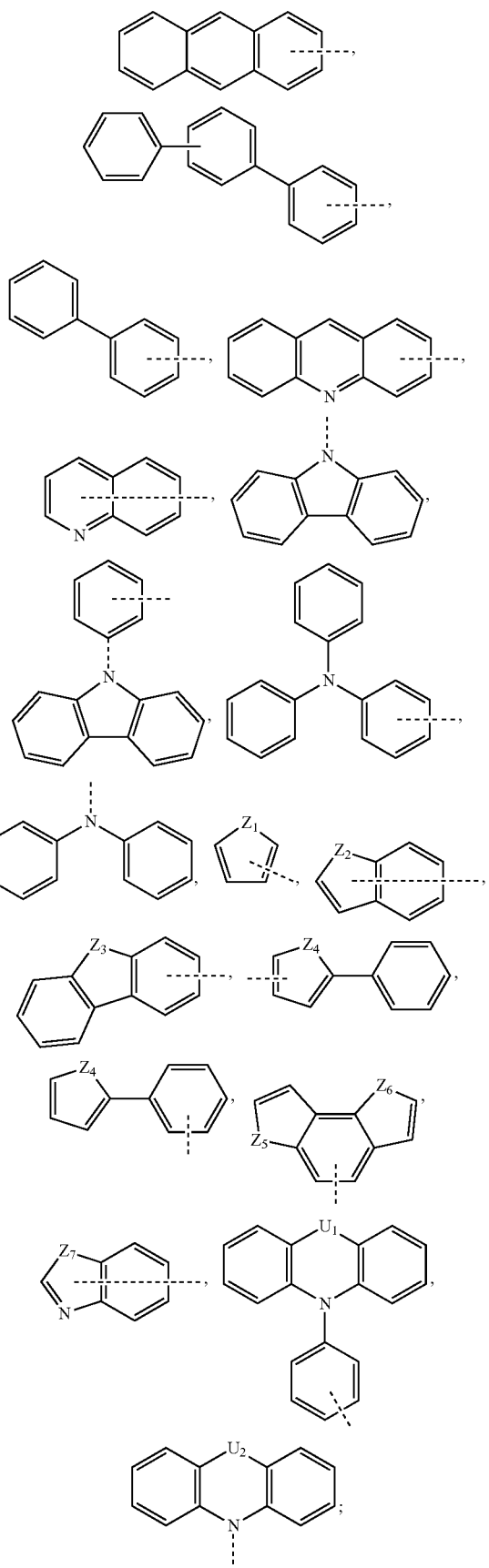

wherein the dashed line represents a linkage site of the group;

Z$_1$ to Z$_7$ each is any one independently selected from a group consisting of O, S, and N—R$_{N1}$;

U$_1$ and U$_2$ each is any one independently selected from a group consisting of O, S, N—R$_{N2}$, and R$_{C1}$—C—R$_{C2}$;

R$_{N1}$, R$_{N2}$, R$_{C1}$, and R$_{C2}$ each is any one selected from a group consisting of hydrogen, C1 to C10 linear or branched alkyl, C1 to C10 alkoxy, C6 to C20 aryl, and C3 to C20 heteroaryl; and the substituent is at least one selected from a group consisting of C1 to C10 linear or branched alkyl, C1 to C10 alkoxy, and C1 to C10 thioalkoxy.

3. The electroluminescent compound of claim 1, wherein the electroluminescent compound has a structure represented by Formula II:

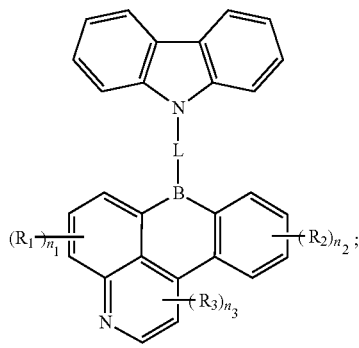

Formula II wherein R$_1$, R$_2$, and R$_3$ each independently has the same definition as in claim 1;

L is C6 to C30 arylene or C3 to C30 heteroarylene;

n$_1$ is an integer from 0 to 3;

n$_2$ is an integer from 0 to 4; and n$_3$ is an integer from 0 to 2.

4. The electroluminescent compound of claim 1, wherein the electroluminescent compound has a structure represented by Formula III:

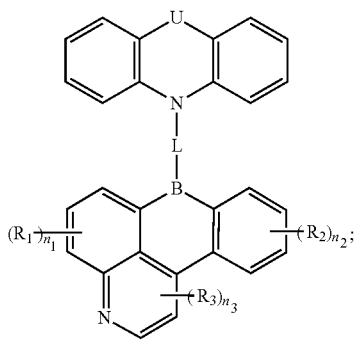

Formula III wherein U is any one selected from a group consisting of O, S, N—R$_{U1}$, and R$_{U2}$—C—R$_{U3}$, wherein R$_{U1}$, R$_{U2}$, and R$_{U3}$ each is any one independently selected from a group consisting of hydrogen, C1 to C10 linear or branched alkyl, C1 to C10 alkoxy, C6 to C20 aryl, and C3 to C20 heteroaryl;

R$_1$, R$_2$, and R$_3$ each independently has the same definition as in claim 1;

L is C6 to C30 arylene or C3 to C30 heteroarylene;

n$_1$ is an integer from 0 to 3;

n$_2$ is an integer from 0 to 4; and n$_3$ is an integer from 0 to 2.

5. The electroluminescent compound of claim 4, wherein U is any one selected from a group consisting of O, S, N—R$_{U1}$, and

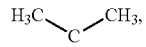

wherein R$_{U1}$ is C6 to C20 aryl or C3 to C20 heteroaryl.

6. The electroluminescent compound of claim 1, wherein the electroluminescent compound has a structure represented by Formula IV:

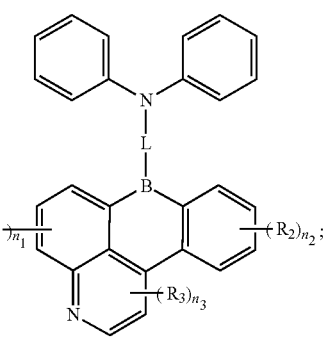

Formula IV wherein R$_1$, R$_2$, and R$_3$ each independently has the same definition as in claim 1;

L is C6 to C30 arylene or C3 to C30 heteroarylene;

n$_1$ is an integer from 0 to 3;

n$_2$ is an integer from 0 to 4; and n$_3$ is an integer from 0 to 2.

7. The electroluminescent compound of claim 1, wherein L is selected from a group consisting of C6 to C24 arylene, C3 to C20 N-containing heteroarylene, and C3 to C20 O-containing heteroarylene.

8. The electroluminescent compound of claim 7, wherein L is any one selected from following groups:

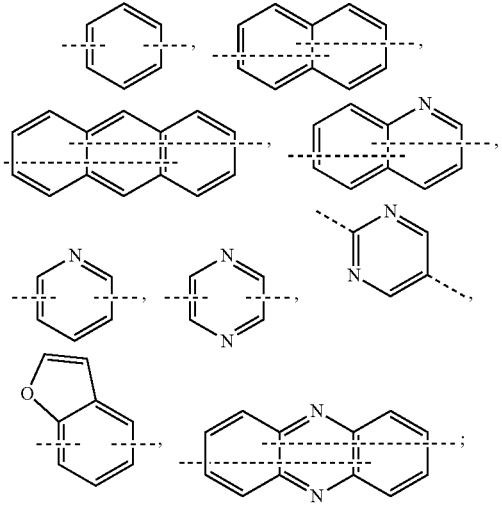

wherein the dashed line represents a linkage site of the group.

9. The electroluminescent compound of claim 1, wherein $R_1$, $R_2$, and $R_3$ each is any one independently selected from following groups, or any one independently selected from the following groups substituted by a substituent:

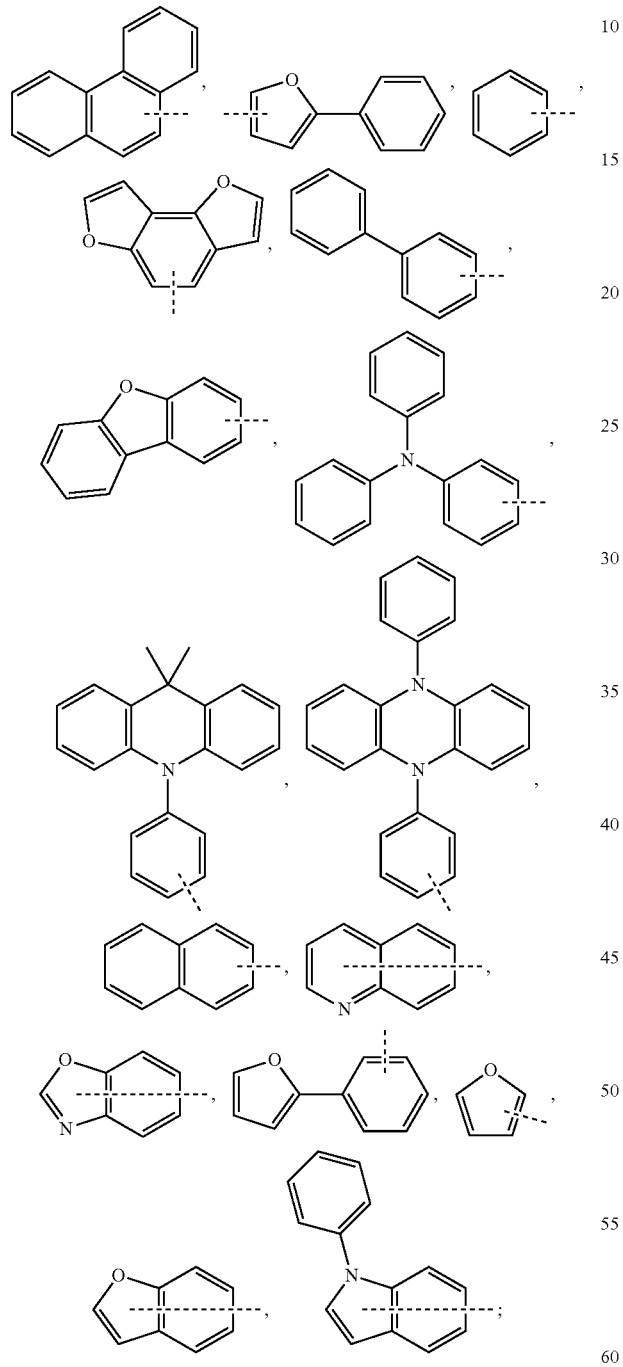

wherein the dashed line represents a linkage site of the group; and the substituent is at least one selected from a group consisting of C1 to C10 linear or branched alkyl, C1 to C10 alkoxy, and C1 to C10 thioalkoxy.

10. The electroluminescent compound of claim 1, wherein the electroluminescent compound is any one selected from following compounds M1 to M50:

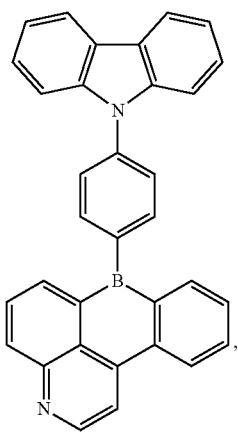

M1

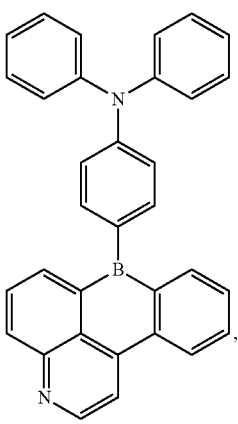

M2

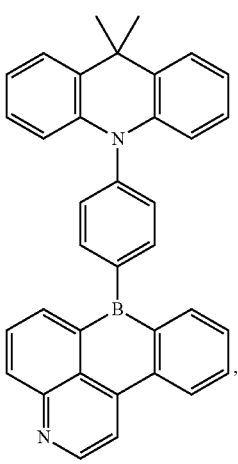

M3

M4
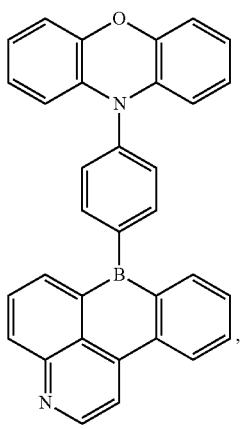
M5
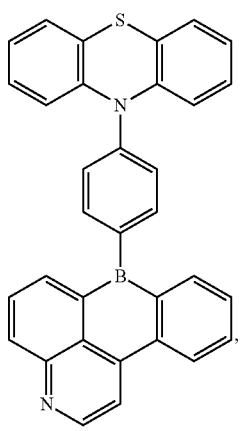
M6
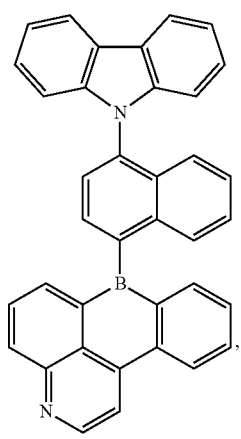
M7
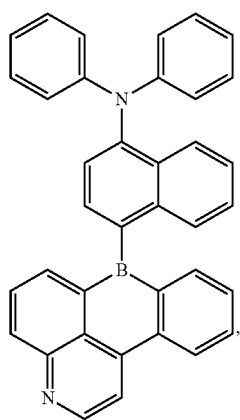
M8
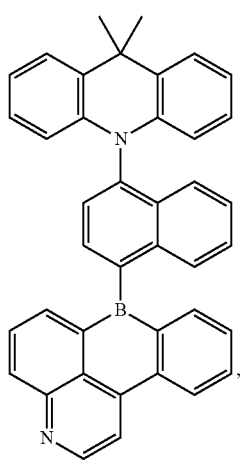
M9
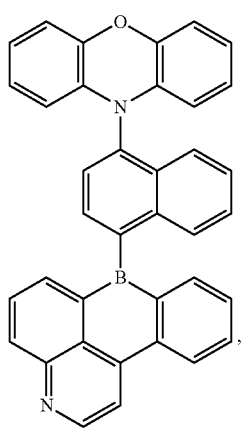

M10 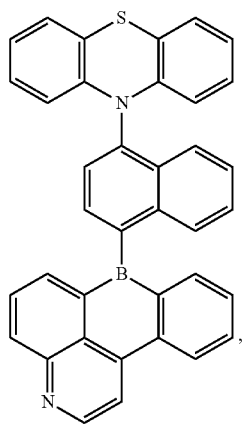
M11 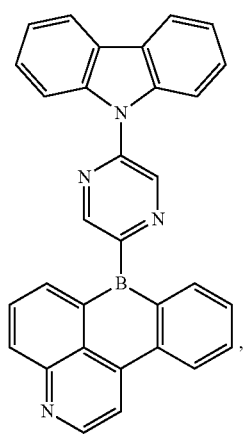
M12 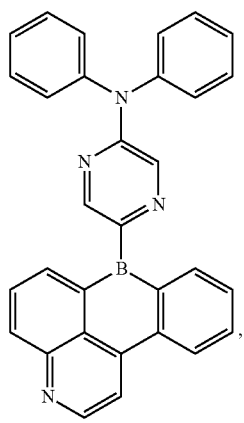
M13 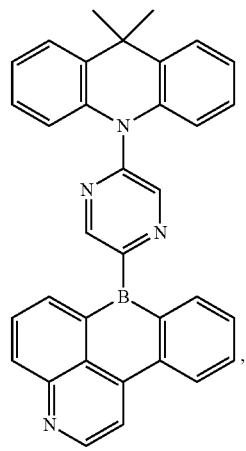
M14 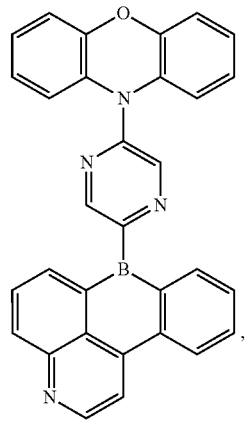
M15 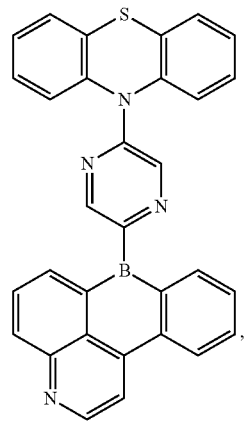

M16
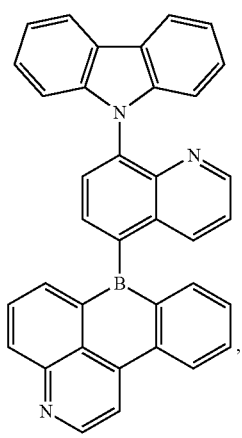
M17
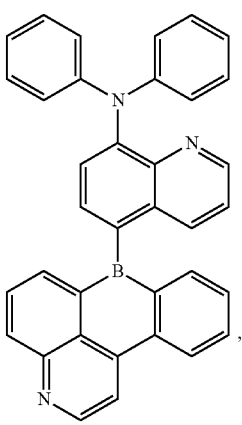
M18
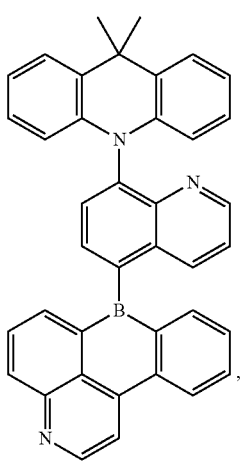
M19
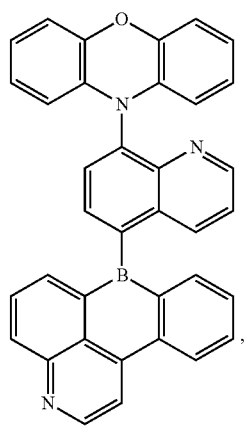
M20
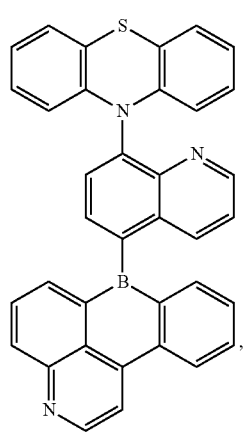
M21
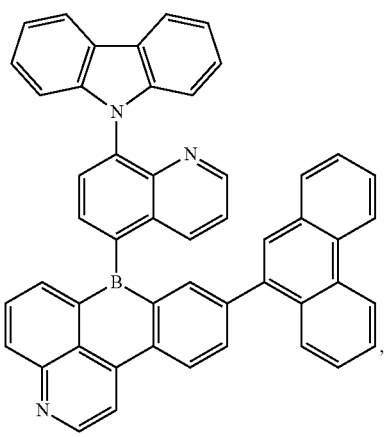

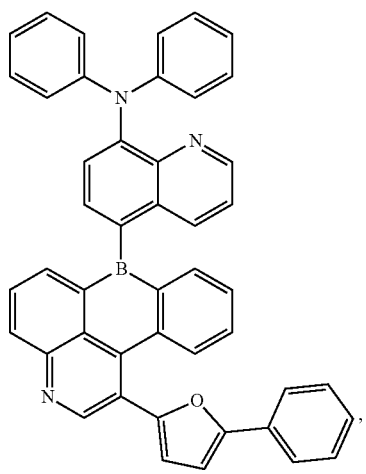 M22
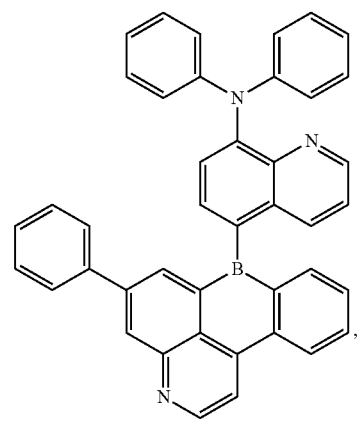 M23
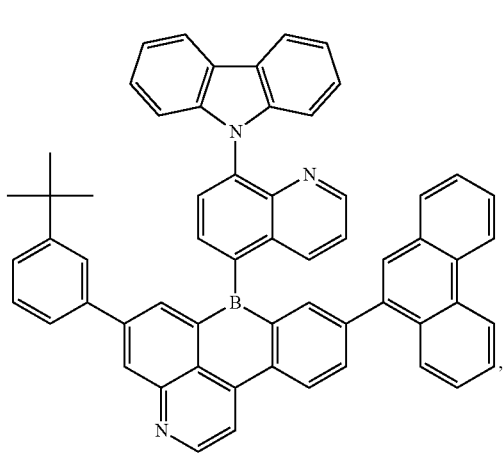 M24
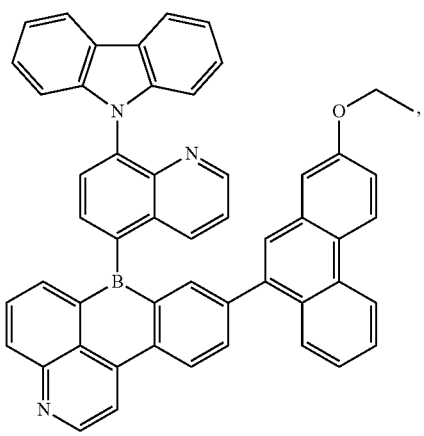 M25
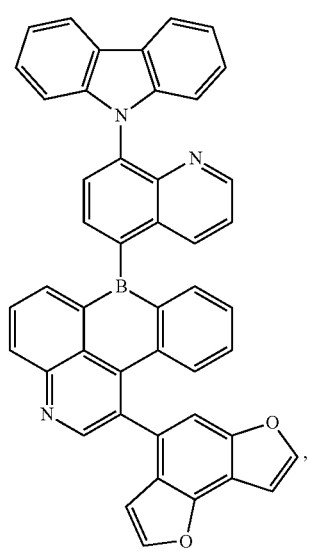 M26
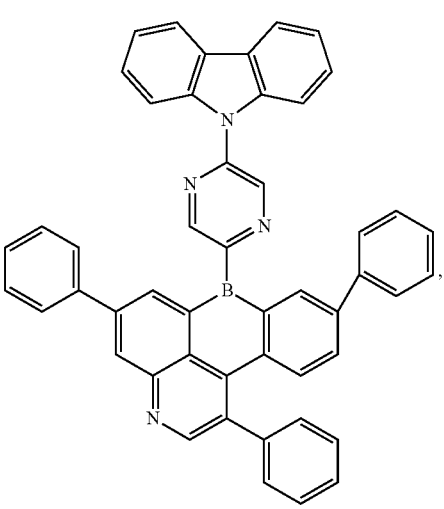 M27

M28
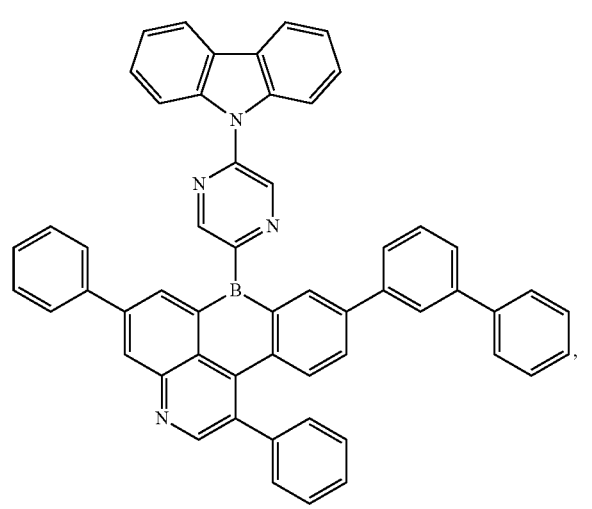
M29
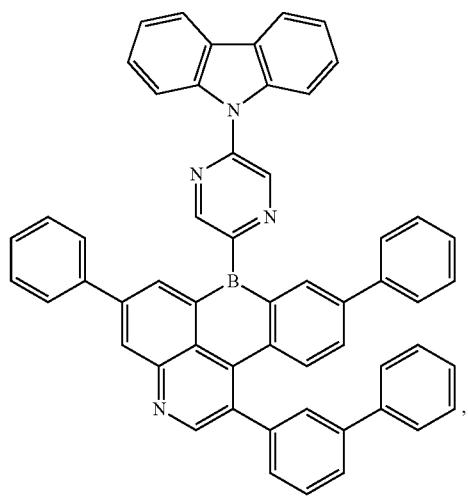
M30
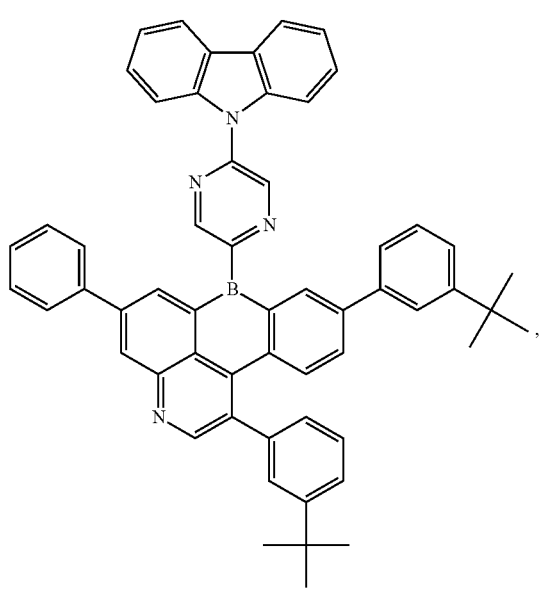
M31
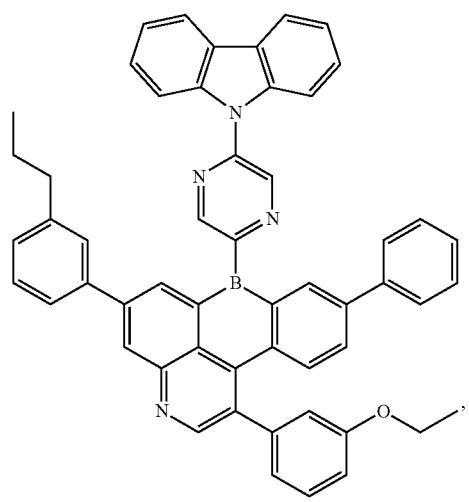
M32
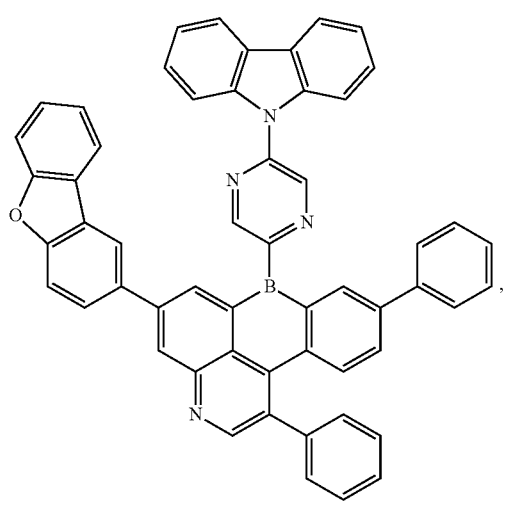
M33
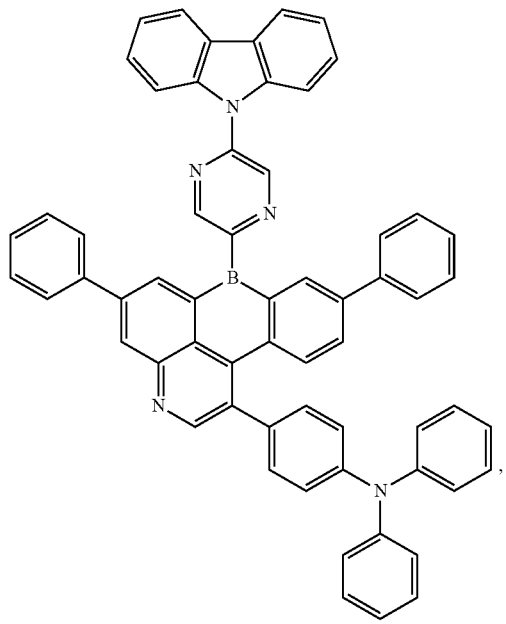

M34
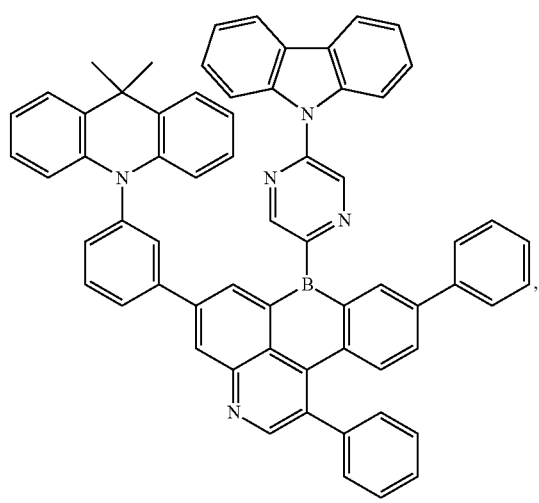
M37
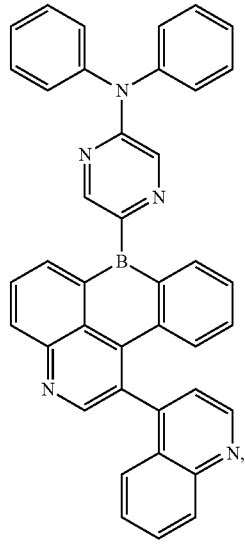
M35
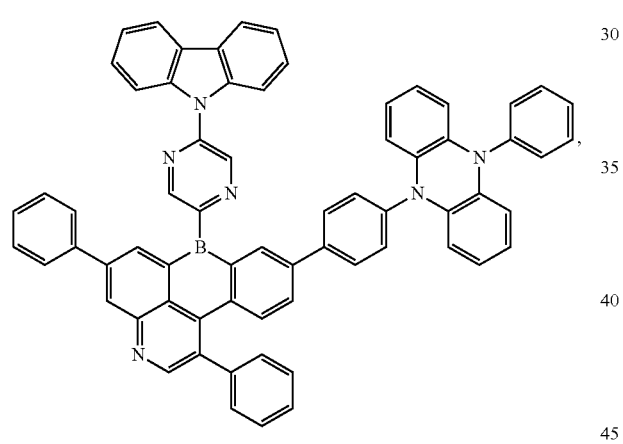
M38
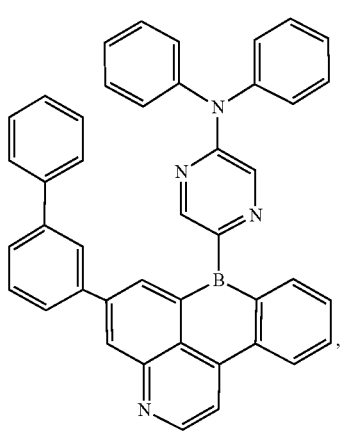
M36
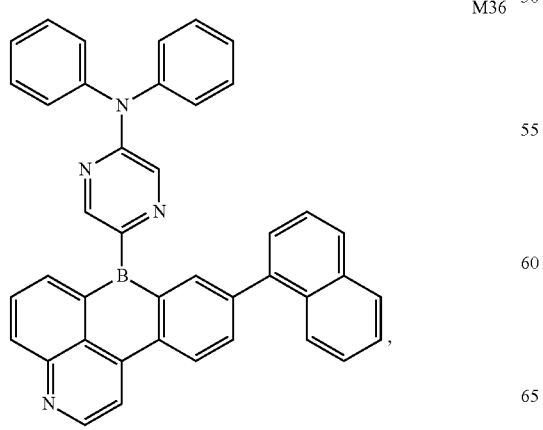
M39
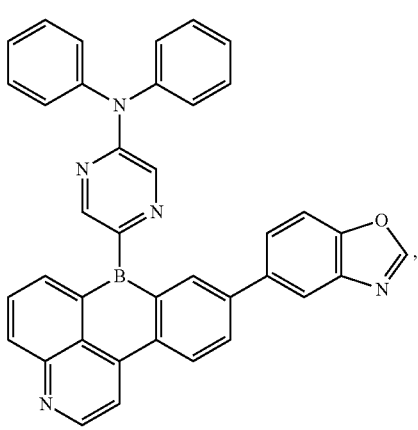

M40
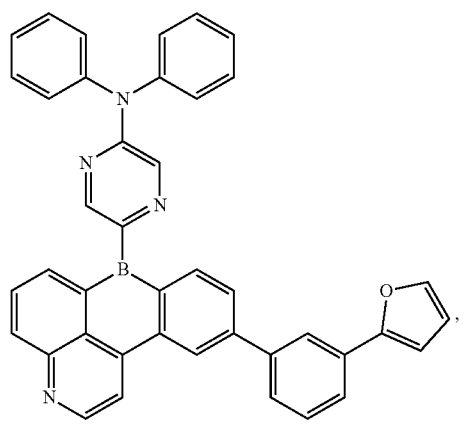
M41
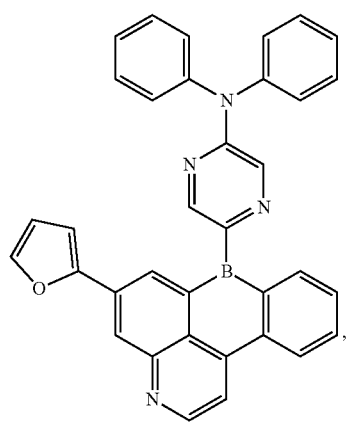
M42
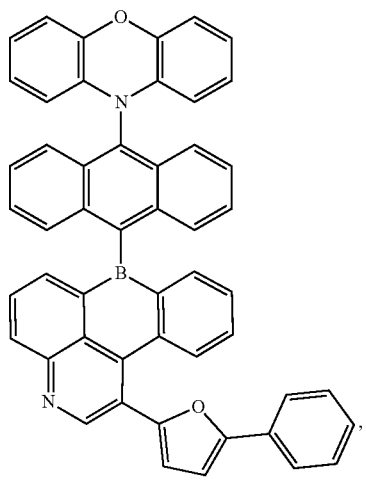
M43
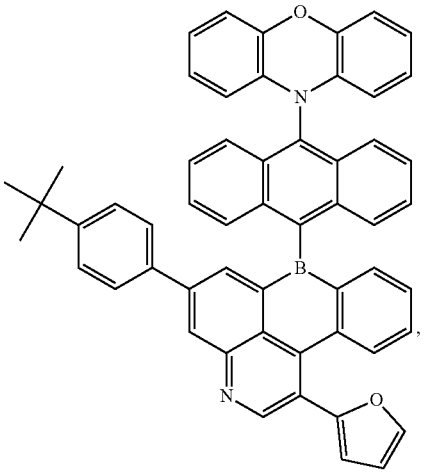
M44
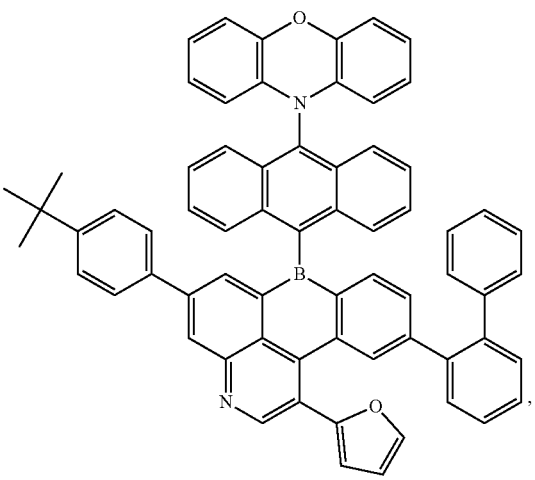
M45
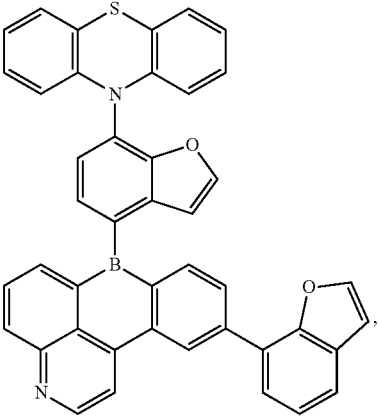

-continued

M46
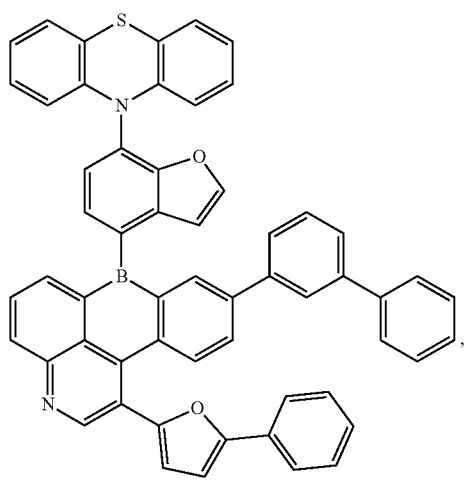

M47
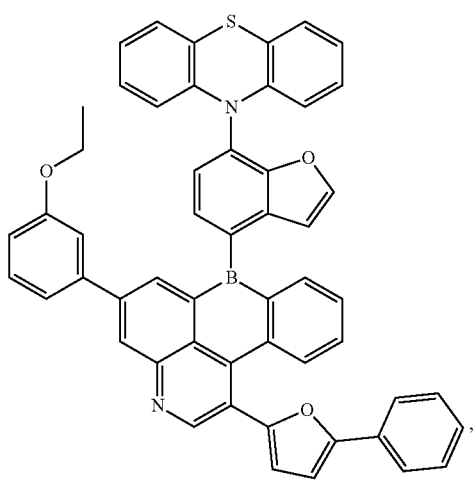

M48
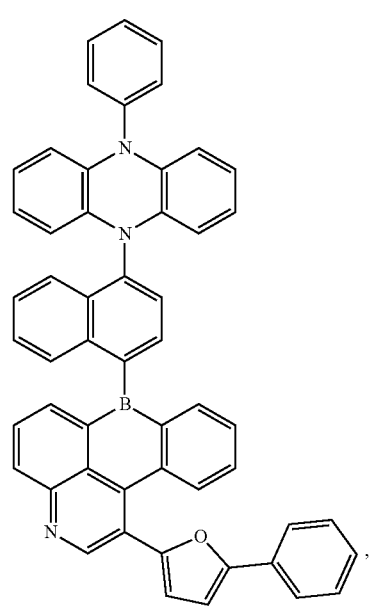

-continued

M49
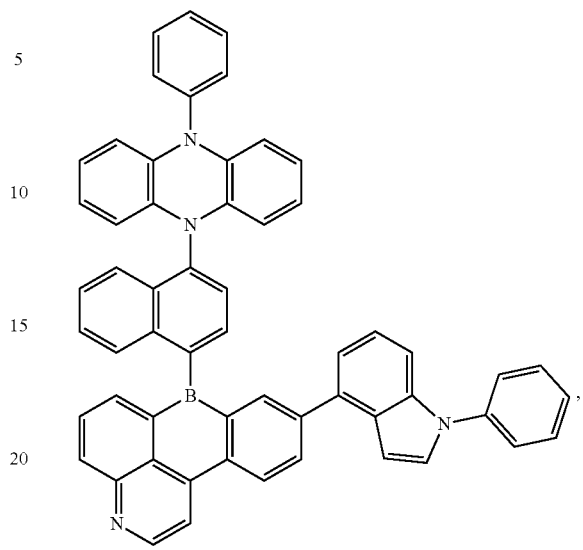

M50
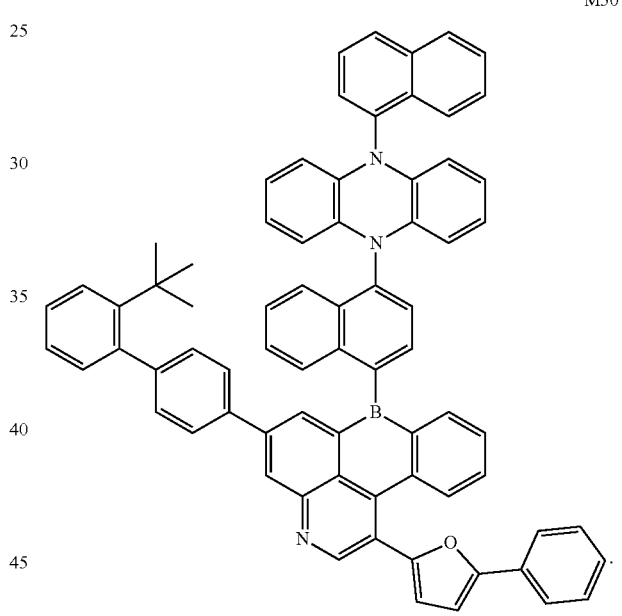

11. A thermally activated delayed fluorescence material, comprising any one of or a combination of at least two of the electroluminescent compound of claim 1.

12. The thermally activated delayed fluorescence material of claim 11, wherein the thermally activated delayed fluorescence material has an energy level difference between a lowest singlet state $S_1$ and a lowest triplet state $T_1$ of $\Delta E_{ST}=E_{S1}-E_{T1} \leq 0.30$ eV.

13. A display panel, comprising an organic light emitting diode (OLED) device, wherein the OLED device comprises an anode, a cathode, and at least one organic thin film layer between the anode and the cathode, wherein the organic thin film layer comprises a light emitting layer;

wherein the light emitting layer comprises the thermally activated delayed fluorescence material of claim 11, wherein the thermally activated delayed fluorescence material is used as any one of a host material, a guest material, or a co-doping material.

14. The display panel of claim 13, wherein the organic thin film layer further comprises any one of or a combination of at least two of a hole transport layer, a hole injection layer, an electron blocking layer, a hole blocking layer, an electron transport layer, and an electron injection layer.

15. An electronic apparatus, comprising the display panel of claim 13.

* * * * *